(12) United States Patent
Zhang et al.

(10) Patent No.: US 8,653,534 B2
(45) Date of Patent: Feb. 18, 2014

(54) JUNCTION BARRIER SCHOTTKY DIODES WITH CURRENT SURGE CAPABILITY

(75) Inventors: Qingchun Zhang, Cary, NC (US); Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/547,014

(22) Filed: Jul. 11, 2012

(65) Prior Publication Data
US 2012/0273802 A1 Nov. 1, 2012

Related U.S. Application Data

(63) Continuation of application No. 12/124,341, filed on May 21, 2008, now Pat. No. 8,232,558.

(51) Int. Cl.
*H01L 29/15* (2006.01)

(52) U.S. Cl.
USPC ...... 257/77; 257/471; 257/484; 257/E29.104; 257/E29.338

(58) Field of Classification Search
USPC .......................................... 257/77, 471, 484
See application file for complete search history.

(56) References Cited

U.S. PATENT DOCUMENTS

| | | | |
|---|---|---|---|
| 3,439,189 A | 4/1969 | Petry | |
| 3,629,011 A | 12/1971 | Tohi et al. | |
| 3,924,024 A | 12/1975 | Naber et al. | |
| 4,160,920 A | 7/1979 | Courier de Méré | |
| 4,242,690 A | 12/1980 | Temple | |
| 4,466,172 A | 8/1984 | Batra | |
| 4,570,328 A | 2/1986 | Price et al. | |
| 4,581,542 A | 4/1986 | Steigerwald | |
| 4,641,174 A | 2/1987 | Baliga | |
| 4,644,637 A | 2/1987 | Temple | |
| 4,811,065 A | 3/1989 | Cogan | |
| 4,827,322 A | 5/1989 | Takata | |
| 4,875,083 A | 10/1989 | Palmour | |
| 4,927,772 A | 5/1990 | Arthur et al. | |
| 4,945,394 A | 7/1990 | Palmour et al. | |
| 4,946,547 A | 8/1990 | Palmour et al. | |

(Continued)

FOREIGN PATENT DOCUMENTS

| CN | 1259228 A | 7/2000 |
|---|---|---|
| DE | 3942640 A1 | 8/1990 |

(Continued)

OTHER PUBLICATIONS

International Search Report Corresponding to International Application No. PCT/US12/27874; Date of Mailing: Jul. 13, 2012; 7 Pages.

(Continued)

*Primary Examiner* — A. Sefer
(74) *Attorney, Agent, or Firm* — Withrow & Terranova, P.L.L.C.

(57) ABSTRACT

An electronic device includes a silicon carbide drift region having a first conductivity type, a Schottky contact on the drift region, and a plurality of junction barrier Schottky (JBS) regions at a surface of the drift region adjacent the Schottky contact. The JBS regions have a second conductivity type opposite the first conductivity type and have a first spacing between adjacent ones of the JBS regions. The device further includes a plurality of surge protection subregions having the second conductivity type. Each of the surge protection subregions has a second spacing between adjacent ones of the surge protection subregions that is less than the first spacing.

24 Claims, 7 Drawing Sheets

(56) References Cited

U.S. PATENT DOCUMENTS

| | | | |
|---|---|---|---|
| 5,011,549 A | 4/1991 | Kong et al. |
| 5,017,976 A | 5/1991 | Sugita |
| 5,028,977 A | 7/1991 | Kenneth et al. |
| 5,032,888 A | 7/1991 | Seki |
| 5,041,881 A | 8/1991 | Bishop et al. |
| 5,111,253 A | 5/1992 | Korman et al. |
| 5,155,289 A | 10/1992 | Bowles |
| 5,166,760 A | 11/1992 | Mori et al. |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,262,669 A | 11/1993 | Wakatabe et al. |
| 5,270,554 A | 12/1993 | Palmour |
| 5,292,501 A | 3/1994 | Degenhardt et al. |
| 5,296,395 A | 3/1994 | Khan et al. |
| 5,342,803 A | 8/1994 | Shimoji |
| 5,345,100 A | 9/1994 | Kan et al. |
| 5,348,895 A | 9/1994 | Smayling et al. |
| 5,371,383 A | 12/1994 | Miyata et al. |
| 5,384,270 A | 1/1995 | Ueno |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A | 3/1995 | Baliga |
| 5,399,887 A | 3/1995 | Weitzel et al. |
| 5,459,107 A | 10/1995 | Palmour |
| 5,468,654 A | 11/1995 | Harada |
| 5,473,176 A | 12/1995 | Kakumoto |
| 5,479,316 A | 12/1995 | Smrtic et al. |
| 5,488,236 A | 1/1996 | Baliga et al. |
| 5,506,421 A | 4/1996 | Palmour |
| 5,510,281 A | 4/1996 | Ghezzo et al. |
| 5,510,630 A | 4/1996 | Agarwal et al. |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,629,531 A | 5/1997 | Palmour |
| 5,710,059 A | 1/1998 | Rottner |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,753,960 A | 5/1998 | Dickmann |
| 5,763,905 A | 6/1998 | Harris |
| 5,767,540 A | 6/1998 | Shimizu |
| 5,776,837 A | 7/1998 | Palmour |
| 5,804,483 A | 9/1998 | Harris |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller |
| 5,877,045 A | 3/1999 | Kapoor |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A | 10/1999 | Singh |
| 5,972,801 A | 10/1999 | Lipkin et al. |
| 5,977,605 A | 11/1999 | Bakowsky et al. |
| 6,020,600 A | 2/2000 | Miyajima et al. |
| 6,025,233 A | 2/2000 | Terasawa |
| 6,025,608 A | 2/2000 | Harris et al. |
| 6,028,012 A | 2/2000 | Wang |
| 6,040,237 A | 3/2000 | Bakowski et al. |
| 6,048,766 A | 4/2000 | Gardner et al. |
| 6,054,728 A | 4/2000 | Harada et al. |
| 6,057,352 A | 5/2000 | Brown et al. |
| 6,063,698 A | 5/2000 | Tseng et al. |
| 6,083,814 A | 7/2000 | Nilsson |
| 6,096,607 A | 8/2000 | Ueno |
| 6,097,046 A | 8/2000 | Plumton |
| 6,100,169 A | 8/2000 | Suvorov et al. |
| 6,104,043 A | 8/2000 | Hermansson et al. ......... 257/77 |
| 6,107,142 A | 8/2000 | Suvorov et al. |
| 6,117,735 A | 9/2000 | Ueno |
| 6,121,633 A | 9/2000 | Singh et al. |
| 6,133,587 A | 10/2000 | Takeuchi et al. |
| 6,136,727 A | 10/2000 | Ueno |
| 6,136,728 A | 10/2000 | Wang |
| 6,165,822 A | 12/2000 | Okuno et al. |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,680 B1 | 4/2001 | Carter, Jr. et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,246,076 B1 | 6/2001 | Lipkin et al. |
| 6,297,100 B1 | 10/2001 | Kumar et al. |
| 6,297,172 B1 | 10/2001 | Kashiwagi |
| 6,303,508 B1 | 10/2001 | Alok |
| 6,316,791 B1 | 11/2001 | Schörner et al. |
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,501,145 B1 | 12/2002 | Kaminski et al. |
| 6,515,303 B2 | 2/2003 | Ring |
| 6,524,900 B2 | 2/2003 | Dahlqvist et al. ............. 438/167 |
| 6,548,333 B2 | 4/2003 | Smith |
| 6,551,865 B2 | 4/2003 | Kumar et al. |
| 6,573,534 B1 | 6/2003 | Kumar et al. |
| 6,593,620 B1 | 7/2003 | Hshieh et al. |
| 6,610,366 B2 | 8/2003 | Lipkin |
| 6,627,539 B1 | 9/2003 | Zhao et al. |
| 6,649,497 B2 | 11/2003 | Ring |
| 6,649,995 B2 | 11/2003 | Tooi et al. |
| 6,653,659 B2 | 11/2003 | Ryu et al. |
| 6,696,705 B1 | 2/2004 | Barthelmess et al. |
| 6,703,642 B1 | 3/2004 | Shah |
| 6,743,703 B2 * | 6/2004 | Rodov et al. .................. 438/527 |
| 6,767,843 B2 | 7/2004 | Lipkin et al. |
| 6,861,723 B2 * | 3/2005 | Willmeroth .................... 257/471 |
| 6,936,850 B2 | 8/2005 | Friedrichs et al. |
| 6,946,739 B2 | 9/2005 | Ring |
| 6,949,401 B2 | 9/2005 | Kaminski et al. |
| 6,956,238 B2 | 10/2005 | Ryu et al. |
| 6,976,936 B2 | 12/2005 | Yamaoka et al. |
| 6,979,863 B2 | 12/2005 | Ryu |
| 7,026,650 B2 | 4/2006 | Ryu et al. |
| 7,074,643 B2 | 7/2006 | Ryu |
| 7,118,970 B2 | 10/2006 | Das et al. |
| 7,125,786 B2 | 10/2006 | Ring et al. |
| 7,183,575 B2 | 2/2007 | Shimoida et al. |
| 7,186,609 B2 | 3/2007 | Korec et al. |
| 7,221,010 B2 | 5/2007 | Ryu |
| 7,253,031 B2 | 8/2007 | Takahashi et al. |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,528,040 B2 | 5/2009 | Das et al. |
| 7,544,963 B2 | 6/2009 | Saxler |
| 7,547,578 B2 | 6/2009 | Agarwal et al. |
| 7,548,112 B2 | 6/2009 | Sheppard |
| 7,649,213 B2 * | 1/2010 | Hatakeyama et al. ........ 257/127 |

(56) References Cited

U.S. PATENT DOCUMENTS

| | | |
|---|---|---|
| 7,687,825 B2 | 3/2010 | Zhang |
| 7,728,402 B2 | 6/2010 | Zhang et al. |
| 7,781,786 B2 | 8/2010 | Hayashi et al. |
| 7,851,881 B1* | 12/2010 | Zhao et al. ............... 257/471 |
| 7,893,467 B2 | 2/2011 | Yamamoto et al. |
| 7,902,054 B2 | 3/2011 | Tsuchida et al. |
| 7,994,033 B2 | 8/2011 | Yoshii |
| 2001/0055852 A1 | 12/2001 | Moise et al. |
| 2002/0030191 A1 | 3/2002 | Das et al. |
| 2002/0038891 A1 | 4/2002 | Ryu et al. |
| 2002/0047125 A1 | 4/2002 | Fukuda et al. |
| 2002/0072247 A1 | 6/2002 | Lipkin et al. |
| 2002/0102358 A1 | 8/2002 | Das et al. |
| 2002/0121641 A1 | 9/2002 | Alok et al. |
| 2002/0125482 A1 | 9/2002 | Friedrichs et al. |
| 2002/0125541 A1 | 9/2002 | Korec et al. |
| 2003/0025175 A1 | 2/2003 | Asano et al. |
| 2003/0057482 A1 | 3/2003 | Harada |
| 2003/0107041 A1 | 6/2003 | Tanimoto et al. |
| 2003/0137010 A1 | 7/2003 | Friedrichs et al. |
| 2003/0178672 A1 | 9/2003 | Hatakeyama et al. |
| 2003/0201455 A1 | 10/2003 | Takahashi et al. |
| 2004/0016929 A1 | 1/2004 | Nakatsuka et al. |
| 2004/0079989 A1 | 4/2004 | Kaneko et al. |
| 2004/0082116 A1 | 4/2004 | Kub et al. |
| 2004/0173801 A1* | 9/2004 | Willmeroth ............... 257/73 |
| 2004/0183079 A1 | 9/2004 | Kaneko et al. |
| 2004/0211980 A1 | 10/2004 | Ryu |
| 2004/0212011 A1 | 10/2004 | Ryu |
| 2004/0256659 A1 | 12/2004 | Kim et al. |
| 2004/0259339 A1 | 12/2004 | Tanabe et al. |
| 2005/0001268 A1 | 1/2005 | Baliga |
| 2005/0012143 A1 | 1/2005 | Tanaka et al. |
| 2005/0062124 A1 | 3/2005 | Chiola |
| 2005/0104072 A1 | 5/2005 | Slater, Jr. et al. |
| 2005/0139936 A1 | 6/2005 | Li |
| 2005/0151138 A1 | 7/2005 | Slater, Jr. et al. |
| 2005/0181536 A1 | 8/2005 | Tsuji |
| 2005/0224838 A1 | 10/2005 | Tanaka et al. |
| 2005/0245034 A1 | 11/2005 | Fukuda et al. |
| 2005/0275055 A1 | 12/2005 | Parthasarathy et al. |
| 2006/0011128 A1 | 1/2006 | Ellison et al. |
| 2006/0060884 A1 | 3/2006 | Ohyanagi et al. |
| 2006/0065899 A1 | 3/2006 | Hatakeyama et al. |
| 2006/0086997 A1 | 4/2006 | Kanaya et al. |
| 2006/0211210 A1 | 9/2006 | Bhat et al. |
| 2006/0244010 A1 | 11/2006 | Saxler |
| 2006/0255423 A1 | 11/2006 | Ryu et al. ............... 257/485 |
| 2006/0261347 A1 | 11/2006 | Ryu et al. |
| 2006/0261876 A1 | 11/2006 | Agarwal et al. |
| 2006/0267021 A1 | 11/2006 | Rowland et al. |
| 2007/0066039 A1 | 3/2007 | Agarwal et al. |
| 2007/0120148 A1 | 5/2007 | Nogome |
| 2007/0164321 A1 | 7/2007 | Sheppard et al. |
| 2007/0228505 A1 | 10/2007 | Mazzola et al. |
| 2007/0235745 A1 | 10/2007 | Hayashi et al. |
| 2007/0241427 A1 | 10/2007 | Mochizuki et al. |
| 2008/0001158 A1 | 1/2008 | Das et al. |
| 2008/0006848 A1 | 1/2008 | Chen et al. |
| 2008/0029838 A1 | 2/2008 | Zhang et al. ............... 257/475 |
| 2008/0105949 A1 | 5/2008 | Zhang et al. |
| 2008/0191304 A1 | 8/2008 | Zhang et al. |
| 2008/0230787 A1 | 9/2008 | Suzuki et al. |
| 2008/0246085 A1 | 10/2008 | Saito et al. |
| 2008/0251793 A1 | 10/2008 | Mazzola et al. ............... 257/77 |
| 2008/0277669 A1 | 11/2008 | Okuno et al. ............... 257/77 |
| 2008/0296771 A1 | 12/2008 | Das et al. |
| 2009/0008651 A1 | 1/2009 | Okuno et al. |
| 2009/0085064 A1 | 4/2009 | Rueb et al. |
| 2009/0121319 A1 | 5/2009 | Zhang et al. |
| 2009/0146154 A1 | 6/2009 | Zhang et al. |
| 2009/0212301 A1 | 8/2009 | Zhang et al. |
| 2009/0267141 A1 | 10/2009 | Matocha et al. |
| 2009/0267200 A1 | 10/2009 | Gutt et al. |
| 2010/0140628 A1 | 6/2010 | Zhang |
| 2010/0258897 A1 | 10/2010 | Lui et al. |

FOREIGN PATENT DOCUMENTS

| | | |
|---|---|---|
| DE | 4210402 A1 | 10/1992 |
| DE | 29504629 U1 | 6/1995 |
| DE | 19633183 A1 | 2/1998 |
| DE | 19723176 C1 | 8/1998 |
| DE | 19809554 A1 | 9/1998 |
| DE | 19900171 A1 | 7/1999 |
| DE | 10036208 A1 | 2/2002 |
| DE | 19633184 B4 | 10/2006 |
| EP | 0176778 A2 | 4/1986 |
| EP | 0192229 A2 | 8/1986 |
| EP | 0269294 A1 | 6/1988 |
| EP | 0380340 A2 | 1/1989 |
| EP | 0389863 A1 | 10/1990 |
| EP | 0735591 A1 | 10/1996 |
| EP | 0837508 A2 | 4/1998 |
| EP | 0865085 A1 | 9/1998 |
| EP | 0992070 A1 | 4/2000 |
| EP | 1361614 A1 | 11/2003 |
| EP | 1460681 A2 | 9/2004 |
| EP | 1693896 A1 | 8/2006 |
| EP | 1806787 A1 | 7/2007 |
| EP | 1845561 A2 | 10/2007 |
| EP | 2015364 A2 | 1/2009 |
| EP | 2259326 A1 | 12/2010 |
| JP | 60240158 A | 11/1985 |
| JP | 01117363 A | 5/1989 |
| JP | 02-137368 A | 5/1990 |
| JP | 03034466 A | 2/1991 |
| JP | 03105975 A | 5/1991 |
| JP | 03157974 A | 7/1991 |
| JP | 03225870 A | 10/1991 |
| JP | 07-066433 A | 3/1995 |
| JP | 08097441 A | 4/1996 |
| JP | 08264766 A | 10/1996 |
| JP | 08316164 A | 11/1996 |
| JP | 09009522 A | 1/1997 |
| JP | 09205202 A | 8/1997 |
| JP | 11-008399 A | 1/1999 |
| JP | 11191559 A | 7/1999 |
| JP | 11238742 A | 8/1999 |
| JP | 11261061 A | 9/1999 |
| JP | 11266017 A | 9/1999 |
| JP | 11274487 A | 10/1999 |
| JP | 2000049167 A | 2/2000 |
| JP | 2000-077682 A | 3/2000 |
| JP | 2000082812 A | 3/2000 |
| JP | 2000106371 A | 4/2000 |
| JP | 2000-252478 A | 9/2000 |
| JP | 2001-085704 A | 3/2001 |
| JP | 2001085704 A | 3/2001 |
| JP | 2002-314099 | 10/2002 |
| JP | 2002314099 A | 10/2002 |
| JP | 2006-324585 A | 11/2006 |
| JP | 2008-042198 A | 2/2008 |
| JP | 2008-541459 | 11/2008 |
| WO | 9708754 A2 | 3/1997 |
| WO | 9802924 A2 | 1/1998 |
| WO | 9808259 A1 | 2/1998 |
| WO | 9832178 A1 | 7/1998 |
| WO | WO 2006/122252 A2 | 11/2006 |
| WO | 2006135031 A2 | 12/2006 |
| WO | 2007040710 A1 | 4/2007 |

OTHER PUBLICATIONS

Japanese Office Action Corresponding to Japanese Patent Application No. 2011-510504; Mailing Date: Mar. 26, 2013; 1 Page (Foreign Text Only).

Afanasev, V. et al., "Intrinsic SiC/SiO2 Interface States", Phys. Stat. Sol., Received Jan. 31, 1997, vol. 162, pp. 321-337.

Agarwal, A.K. et al., "1.1 kV 4H-SiC Power UMOSFETs", IEEE Electron Devices Letters, Dec. 1997, vol. 18, No. 12, pp. 586-588.

(56) References Cited

OTHER PUBLICATIONS

Agarwal, A.K. et al., "1400 V 4H-SiC Power MOSFETs", Materials Science Forum, Published: 1998, vols. 264-268, pp. 989-992.
Agarwal, A.K. et al., "A Critical Look at the Performance Advantages and Limitations of 4H-SiC Power UMOSFET Structures", Proceedings of the International Symposium on Power Semiconductor Devices and IC's, Published: 1996, pp. 119-122.
Agarwal, A.K. et al., "Investigation of Lateral RESURF, 6H-SiC MOSFETs", Materials Science Forum, Published: 2000, vols. 338-342, pp. 1307-1310.
Agarwal, A.K. et al., "Temperature Dependence of Fowler-Nordheim Current in 6H- and 4H-SiC MOS Capacitors", IEEE Electron Device Letters, Dec. 1997, vol. 18, No. 12, pp. 592-594.
Alok, Dev. et al., "Process Dependence of Inversion Layer Mobility in 4H-SiC Devices", Silicon Carbide and Related Materials, Published: 1999, pp. 1077-1080.
Asano, K. et al., "Dynamic Characteristics of 6.2 kV High Voltage 4H-SiC pn Diode with Low Loss", Transactions of the Institute of Electrical Engineers of Japan, May 2003, vol. 123-D, No. 5, pp. 623-627.
Author Unknown, "Motorola Power MOSFET Transistor Databook", 4th Edition, Motorola, Inc., Copyright: 1998, pp. 254-257.
Author Unknown, "Figure 3", Compound Semiconductor.Net, Updated: May 2006, Retrieved: Jul. 7, 2006, http://www.compoundsemiconductor.net, 4 pages.
Author Unknown, "Insulated-Gate Bipolar Transistor", Wikipedia—The Free Encyclopedia, Updated in Jun. 11, 2010, Retrieved on Jun. 21, 2010, http://en.wikipedia.org/wiki/Insulated-gate_bipolar_transistor, 6 pages.
Author Unknown, "The Insulated Gate Biopolar Transistor (IGBT)", University of Glasgow, Updated: Feb. 14, 2007, Retrieved Jul. 7, 2006, http://www.elec.gla.ac.uk/groups/dev_mod/papers/igbt/igbt.html, 3 pages.
Ayalew, T., "4.4.3.1 MPS Diode Structure", Tu Wien. Jul. 6, 2006, http://www.iue.tuwien.ac.at/phd/ayalew/node88.html, 2 pages.
Baliga, B., "Chapter 7: Power Mosfet", Power Semiconductor Devices, Copyright: 1996, pp. 335-425, Boston, MA, PWS Publishing Company.
Baliga, B., "Chapter 8: Insulated Gate Bipolar Transistor", Power Semiconductor Devices, Copyright: 1996, pp. 426-502, Boston, MA, PWS Publishing Company.
Baliga, B.J., "The Pinch Rectifier: A Low-Forward-Drop High-Speed Power Diode," IEEE Electron Device Letters, vol. EDL-5, No. 6, Jun. 1984, 3 pages.
Bhatnagar, Mohit et al., "Comparison of 6H-SiC, 3C-SiC, and Si for Power Devices", IEEE Transactions on Electron Devices, Mar. 1993, vol. 40, No. 3, pp. 645-655.
Buchner, R. et al., "Laser Recrystallization of Polysilicon for Improved Device Quality", Springer Proceedings in Physics, Copyright: 1989, vol. 55, pp. 289-294.
Capano, M.A. et al., "Ionization Energies and Electron Mobilities in Phosphorus- and Nitrogen-Implanted 4H Silicon Carbide", IEEE ICSCRM Conference 1999, Oct. 10-13, 1999, 4 pages.
Capano, M.A. et al., "Surface Roughening in Ion Implanted 4-H Silicon Carbide", Journal of Electronic Materials, Published: 1999, vol. 28, No. 3, pp. 214-218.
Casady, J.B. et al., "900 V DMOS and 1100 V UMOS 4H-SiC Power FETs", Northrop Grumman Science and Technology Center, Published: 1997, 2 Pages.
Chakraborty, Supratic et al., "Interface Properties of N2O-Annealed SiO2/SiC System", IEEE, Copyright: 2000, pp. 108-111.
Chang, K.C. et al., "Observation of a Non-Stoichiometric Layer at the Silicon Dioxide—Silicon Carbide Interface: Effect of Oxidation Temperature and Post-Oxidation Processing Conditions", Materials Research Social Symposium Procedures, Copyright: 2001, vol. 640, 6 pages.

Chen, Jia-Rong et al., "Theoretical Analysis of Current Crowding Effect in Metal/AlGaN/GaN Schottky Diodes and its Reduction by Using Polysilicon in Anode", Chinese Physics Letters, Jul. 2007, vol. 24, No. 7, pp. 2112-2114.
Cho, Won-Ju et al., "Improvement of Charge Trapping by Hydrogen Post-Oxidation Annealing in Gate Oxide of 4H-SiC metal-oxide-semiconductor capacitors", Applied Physical Letters, Aug. 21, 2000, vol. 77, No. 8, 1215-1217.
Chung, Gilyong et al., "Effects of Anneals in Ammonia on the Interface Trap Density Near the Band Edges in 4H-Silicon Carbide Metal-Oxide-Semiconductor Capacitors", Applied Physical Letters, Nov. 27, 2000, vol. 77, No. 22, pp. 3601-3603.
Chung, G.Y. et al., "The Effect of Si:C Source Ration on S102 /SiC Interface State Density for Nitrogen Doped 4H and 6H SiC", Materials Science Form, Copyright: 2000, vol. 338-342, pp. 1097-1100.
Chung, G.Y. et al., "Effect of Nitric Oxide Annealing on the Interface Trap Densities Near the Band Edges in the 4H Polytype Silicon Carbide", Applied Physics Letters, Mar. 27, 2000, vol. 76, No. 13, pp. 1713-1715.
Chung, G.Y. G Y et al., "Improved Inversion Channel Mobility for 4h-SiC MOSFETs Following High Temperature Anneals in Nitric Oxide", IEEE Electron Device Letters, Apr. 2001, vol. 22, No. 4, pp. 176-178.
Dahlquist, F. et al., "A 2.8kV, Forward Drop JBS Diode with Low Leakage", Materials Science Forum, Copyright: 2000, vols. 338-342, pp. 1179-1182.
Das, Mrinal K. et al., "A 13 kV 4H-SiC n-Channel IGBT with Low Rdiff on and Fast Switching", DARPA Contract, Published: 2007, 4 Pages.
Das, M.K. et al., "High Mobility 4H-SiC Inversion Mode MOSFETs Using Thermally Grown", No Annealed SiO2,, IEEE 58th Device Research Conference, Jun. 19-21, 2000, 3 Pages.
Das, M.K. et al., "Inversion Channel Mobility in 4H- and 6H-SiC MOSFETs", School of Electrical and Computer Engineering at Purdue University, Published: 1998, 2 pages.
Das, Mrinal K., "Fundamental Studies of the Silicon Carbide MOS Structure", Thesis submitted to Purdue University for Doctorate of Philosophy Program, Dec. 1999, 160 Pages.
Dastidar, Sujoyita, "A Study of P-Type Activation in Silicon Carbide", Thesis submitted to Faculty of Purdue University, May 1998, 102 Pages.
De Meo, R.C. et al., "Thermal Oxidation of SiC in N2O", The Electrochemical Society, Inc., Nov. 1994, vol. 141, No. 11, pp. L150-L152.
Del Prado, A. et al., "Full Composition Range Silicon Oxynitride Films Deposited by ECR-PECVD at Room Temperature", Thin Solid Films, Published: 1999, vols. 343-344, pp. 437-440.
Dimitrijev, Sima et al., "Nitridation of Silicon-Dioxide Films Grown on 6H Silicon Carbide", IEEE Electron Device Letters, May 1997, vol. 18, No. 5, pp. 175-177.
Feldman, Leonard C. et al., "High Performance SiC Power Devices via Atomic Scale Engineering", 1999 DARPA/MTO High Power and ONR Power Switching Review, Aug. 10-12, 1999, 20 pages.
Fukuda, Kenji et al., "Improvement of SiO2/4H-SiC Interface by Using High Temperature Hydrogen Annealing at 1000° C.", External Abstracts of the 1998 International Conference on Solid State Devices and Materials, Published: 1998, pp. 100-101.
Fukuda, Kenji et al., "Improvement of SiO2/4H-SiC Interface Using High-Temperature Hydrogen Annealing at Low Pressure and Vacuum Annealing", Japanese Journal of Applied Physics, Copyright: 1999, vol. 38, pp. 2306-2309.
Hubel, Kerstin, "Hybrid Design Improves Diode Robustness and Boosts Efficiency", Compound Semiconductor.Net, Updated: May 2006, Retrieved: Jul. 7, 2006, http://www.compoundsemiconductor.net, 4 pages.
Hull, Brett A. et al., "Drift-Free 10-kV, 20-A 4H-SiC PiN Diodes", Journal of Electronic Materials, Published: 2005, vol. 34, No. 4, pp. 341-344.
Itoh "Analysis of Schottky Barrier Heights of Metal/SiC Contacts and Its Possible Application to High-Voltage Rectifying Devices" Phys. Stat. Sol. (A), vol. 162, 1997, pp. 225-245.

(56) References Cited

OTHER PUBLICATIONS

Itoh "Excellent Reverse Blocking Characteristics of High-Voltage 4H-SiC Schottky Rectifiers with Boron-Implanted Edge Termination" IEEE Electron Device Letters, vol. 17, No. 3, Mar. 1996, pp. 139-141.
Jamet, P. et al., "Physical Properties of N/sub 2/0 and No—Nitrided Fate Oxides Grown on 4H SiC", Applied Physics Letters, Jul. 2001, vol. 79, No. 3, pp. 323-325.
Karlsteen et al., "Electrical Properties of Inhomogeneous SiC MIS Structures," Journal of Electronic Materials, vol. 24, No. 7, Published: 1995, pp. 853-861.
Kinoshita, Kozo et al., "Guard Ring Assisted Resurf: A New Termination Structure Providing Stable and High Breakdown Voltage for SiC Power Devices", IEEE, Copyright: 2002, pp. 253-256.
Kobayashi, K. et al., "Dielectric Breakdown and Current Conduction of Oxide/Nitride/Oxide Multi-Layer Structures", 1990 Symposium of VLSI Technology, Copyright 1990, pp. 119-120.
Krishnaswami, Sumi et al., "High Temperature Characterization of 4H-SiC Bipolar Junction Transistors", Materials Science Forum, Jan. 1, 2009, vols. 527-529, pp. 1437-1440.
Lai, P.T. et al., "Effects of Nitridation and Annealing on Interface Properties of Thermally Oxidized SIO2 /SiC Metal-Oxide-Semiconductor System", Applied Physics Letters, Jun. 19, 2000, vol. 75, No. 25, pp. 3744-3748.
Lai, P.T. et al., "Interface properties of N2O-Annealed NH3-Treated 6H-SiC MOS Capacitor", IEEE, Copyright: 1999, pp. 46-49.
Levinshtein, Michael E. et al., "On the Homogeneity of the Turn-On Process in High-Voltage 4H-SiC Thyristors", Solid-State Electronics, Published: 2005, vol. 49, pp. 233-237.
Li, Y. et al., "High-Voltage (3 kV) UMOSFETs in 4H-SiC", IEEE Transactions on Electron Devices, Jun. 2002, vol. 49, No. 6, pp. 972-975.
Li, H.F. et al., "Improving SiO2 Grown on P-Type 4H-SiC by NO Annealing", Materials Science Forum, Copyright: 1998, vol. 264-268, pp. 869-872.
Lipkin, Lori et al., "Challenges and State-of-the-Art of Oxides on SiC", Material Research Social Symposium Proceedings, Copyright: 2001, vol. 640, pp. 89-98.
Lipkin, Lori et al., "Insulator Investigation on SiC for Improved Reliability", IEEE Transactions on Electron Devices, Mar. 1999, vol. 46, No. 3, pp. 525-532.
Lipkin, L.A. et al., "Low Interfaces State Density Oxides on P-Type SiC", Materials Science Forum, Copyright: 1998, vols. 264-268, pp. 853-856.
Losee, P.A. et al., "High-Voltage 4H-SiC PiN Rectifiers with Single-Implant, Multi-Zone JTE Termination", Proceedings for 2004 International Symposium on Power Semiconductor Devices & ICs, Published: 2004, pp. 301-304.
Losse, P.A. et al., "Degraded Blocking Performance of 4H-SiC Rectifiers Under High dV/dt Conditions", Proceedings for 17th International Symposium on Power Semiconductor Devices & ICs, May 23-26, 2005, pp. 1-4.
Ma, Y. et al., "Fixed and Trapped Charges at Oxide-Nitride-Oxide Heterostructure Interfaces Formed by Remote Plasma Enhanced Chemical Vapor Deposition", American Vacuum Society, Copyright: 1993, vol. 11, No. 4, pp. 1533-1540.
Matsunami, "Step-controlled Epitaxial Growth of SiC: High Quality Homoepitaxy," Materials Science and Engineering, vol. B201997, Oct. 27, 1996, pp. 153-173.
Mohammad, "Near Ideal Plantinum-GaN Schottky Diodes," Electronic Letters, Mar. 14, 1996, vol. 32, No. 6, pp. 598-599.
Mondal, K. et al., "An Integrated 500-V Power DMOSFET/ Antiparallel Rectifier Device with Improved Diode Reverse Recovery Characteristics", IEEE Electron Device Letters, Sep. 2002, vol. 23, No. 9, pp. 562-564.
Mutin, P. Hubert, "Control of the Composition and Structure of Silicon Oxycarbide and Oxynitride Glasses Derived from polysiloxane precursors", Journal of Sol-Gel Science and Technology, Copyright: 1999, pp. 27-38.
Myer-Ward, R.L. et al., "Turning of Basal Plane Dislocations During Epitaxial Growth on 4 Off-Axis 4h-SiC", 7th European Conference on Silicon Carbide and Related Materials, Sep. 7-11, 2008, retrieved Jul. 1, 2009, http://escrm08.com/invited_presentations.html, Barcelona, Spain, 2 pages.
Palmour, J.W. et al., "SiC Device Technology: Remaining Issues", Diamond and Related Materials, Published: 1997, vol. 5, pp. 1400-1404.
Palmour, John, "Silicon Carbide npnp Thyristors", NASA Tech Briefs. Updated: Dec. 1, 2000, Retrieved Sep. 2, 2010, http://www.techbriefs.com/component/content/article/7031, 3 pages.
Pankin, D. et al., "Electrical and Microstructural Properties of Highly Boron-Implantation Doped 6H-SiC", Journal of Applied Physics, Mar. 15, 2001, vol. 89, No. 6, pp. 3162-3167.
Pantelides, S.T. et al., "Atomic-Scale Engineering of the SiC-SiO2 Interface", Materials Science Forum, Copyright: 2000, vols. 338-342, pp. 1133-1136.
Patel, R. et al., "Phosphorus-Implanted High-Voltage N+P 4H-SiC Junction Rectifiers", Proceedings of 1998 International Symposium on Power Semiconductor Devices & Ics, Published: 1998, pp. 387-390.
Rao, Mulpuri V. et al., "P-N Junction Formation in 6H-SiC Acceptor Implantation into a N-Type Substrate", Nuclear Instructions and Mechanics in Physics Res., Published: 1995, vol. 106, pp. 333-338.
Rao, S. et al., "Silane Overpressure Post-Implant Annealing of Al Dopants in SiC: Cold Wall CVD Apparatus", Applied Surface Science, Published: 2006, vol. 252, pp. 3837-3842.
Rao et al., "Al and N Ion Implantations in 6H-SiC," Inst. Phys. Conf. Ser. No. 142, Chapter 3, Published: 1996, pp. 521-524.
Rao, Mulpuri V., "Maturing Ion-Implantation Technology and its Device Applications in SiC", Solid State Electronics, Published: 2003, vol. 47, pp. 213-222.
Richmond, J.T. et al., "Hybrid 4H-SiC MOS Gated Transistor (MGT)", DARPA Contract #N00014-99-C-0377, Published: 2002, 6 pages.
Ryu, Sei-Hyung et al., "27 mΩ-cm2, 1.6 kV Power DiMOSFETs in 4H-SiC", Proceedings of the 14th International Symposium on Power Semiconductor Devices & ICs 2002, ISPSD '02 Proceedings, Jun. 4-7, 2002, pp. 65-68, Santa Fe, NM.
Schörner, Reinhold et al., "Rugged Power MOSFETs in 6H-SiC with Blocking Capability up to 1800V", Silicon Carbide and Related Materials, Copyright: 2000, vols. 338-342, pp. 1295-1298.
Schörner, Reinhold et al., "Significantly Improved Performance of MOSFET's on Silicon Carbide Using the 15R-SiC Polytype", IEEE Electron Device Letters, May 1999, vol. 20, No. 3, pp. 241-244.
Senzaki, Junji et al., "Effects of Pyrogenic Reoxidation Annealing on Inversion Channel Mobility of 4H-SiC Metal-Oxide-Semiconductor Field-effect Transistor Fabricated on (1120) Face", The Japanese Society of Applied Physics, Nov. 15, 2001, vol. 40, pp. 1201-1203.
Shenoy, Jayarama N. et al., "High-Voltage Double-Implanted Power MOSFET's in 6H-SiC", IEEE Electron Device Letters, Mar. 1997, vol. 18, No. 3, pp. 93-95.
Shenoy, Praveen M. et al., "The Planar 6H-SiC Accufet: A New High-Voltage Power MOSFET Structure", IEEE Electron Device Letters, Sep. 1999, vol. 18, No. 12, pp. 589-591.
Singh, R. et al., "High Temperature, High Current, 4H-SiC Accu-DMOSFET", Silicon Carbide and Related Materials, Copyright: 2000, vols. 338-342, pp. 1271-1274.
Singh, R. et al., "Planar Terminations in 4H-SIC Schottky Diodes with Low Leakage and High Yields", ISPSD '97, Copyright: 1997, pp. 157-160.
Sridevan, S. et al., "Lateral N-Channel Inversion Mode 4H-SiC MOSFET'S", IEEE Electron Devices Letters, Jul. 1998, vol. 19, No. 7, pp. 228-230.
Sridevan, S. et al., "On the Prescence of Aluminum in Thermally Grown Oxides on 6H-Silicon Carbide", IEEE Electron Devices Letters, Mar. 1996, vol. 17, No. 3, pp. 136-138.
Stein Von Kamienski, E.G. et al., "Long Term Stability of Gate-Oxides on N- and P-Type Silicon Carbide Studies by Charge Injection Techniques", Materials Science and Engineering, Published: 1997, vol. 46, pp. 263-266.

(56) References Cited

OTHER PUBLICATIONS

Stengl, R. et al., "Variation of Lateral Doping—A New Concept to Avoid High Voltage Breakdown of Planar Junctions", Science Research Laboratories, Jan. 12, 1985, 4 pages.
Stengl, R. et al., "Variation of Lateral Doping as a Field Terminator for High-Voltage Power Devices", IEEE Transactions on Electron Devices, Mar. 1986, vol. ED-33, No. 3, pp. 426-428.
Streetman, Ben G., "Chapter 7: Bipolar Junction Transistors", Solid State Electronic Devices, Copyright: 1980, pp. 228-284, Englewood Cliffs, NJ, Prentice-Hall, Inc.
Sugawara, Yoshitaka et al., "3.6 kV 4H-SiC JBS Diodes with Low RonS", Materials Science Forum: Silicon Carbide and Related Materials, Copyright: 2000, vol. 338-342, pp. 1183-1186.
Sundaresan, Siddarth G. et al., "Ultra-Low Resistivity A1+ Implanted 4H-SiC Obtained by Microwave Annealing and a Protective Graphite Cap", Solid-State Electronics 52, Published: 2008, pp. 140-145.
Suvorov, A.V. et al., "4H-Sic Self-Aligned Implant-Diffused Structure for Power DMOSFETs", Materials Science Forum, Copyright: 2000, vols. 338-342, pp. 1275-1278.
Suzuki, Seiji et al., "Effect of Post-Oxidation-Annealing in Hydrogen on SiO2 /4H-SiC Interface", Materials Science Forums, Copyright: 2000, vols. 338-342, pp. 1073-1076.
Sze, S.M., "Si-SiO2 MOS Diode", Physics of Semiconductor Devices, 2nd Edition, Copyright: 1981, pp. 383-390, Korea, John Wiley & Sons, Inc.
Sze, S.M., "Chapter 5: Bipolar Transistor and Related Devices", Semiconductor Devices Physics and Technology, Published: 2002, p. 130, United States of America, John Wiley & Sons, Inc.
Tan, J. et al., "High-Voltage Accumulation-Layer UMOSFET's in 4H-SiC", IEEE Electron Device Letters, Sep. 1998, vol. 49, No. 12, pp. 487-489.
Thomas, Chris et al., "Annealing of Ion Implantation Damage in SiC Using a Graphite Mask", Materials Research Society Symposium Proc., Copyright: 1999, vol. 572, pp. 45-50.
Tobin, Philip et al., "Furnace Formation of Silicon Oxynitride Thin Dielectrics in Nitrous Oxide N2O: The Role of Nitric Oxide (NO)", Junior Applied Physics, Feb. 1, 1994, vol. 75, No. 3, pp. 1811-1817.
Torvik, John et al., "Electrical Characterization of GaN/SiC n-p. Heterojunction Diodes", Applied Physics Letters, Published: 1998, vol. 72, pp. 1371-1373.
Treu, M. et al., "A Surge Current Stable and Avalanche Rugged SiC Merged Pn Schottky Diode Blocking 600V Especially Suited for PFC Applications", Materials Science Forum: Silicon Carbide and Related Materials, Copyright: 2005, vol. 527-539, pp. 1155-1158.
Ueno, Katsunori et al., "The Guard-Ring Termination for High-Voltage SiC Schottky Barrier Diodes", IEEE Electron Device Letters, Jul. 1995, vol. 16, No. 7, pp. 331-332.
Ueno, Katsunori et al., "4H-SiC MOSFET's Utilizing the H2 Surface Cleaning Technique", IEEE Electron Device Letters, Jul. 1998, vol. 19, No. 7, pp. 244-246.
Ueno, Katsunori et al., "Counter-Doped MOSFET's of 4H-SiC", IEEE Electron Device Letters, Dec. 1999, vol. 20, No. 12, pp. 624-626.
Unknown, "Data Book for Metals" published as early as Mar. 19, 2009, p. 194.
Vassilveski, K. et al., "High Voltage Silicon Carbide Schottky Diodes with Single Zone Junction Termination Extension", Materials Science Forum, Copyright: 2007, pp. 873-876, Switzerland, Trans Tech Publications.
Vassilveski, K.V. et al., "Protection of Selectively Implanted and Patterned Silicon Carbide Surfaces with Graphite Capping Layer During Post-Implantation Annealing", Semiconductor Science and Technology, Feb. 3, 2005, pp. 271-278, Switzerland, Trans Tech Publications.
Vathulya, Vickram et al., "A Novel 6H-SiC Power DMOSFET with Implanted P-Well Spacer", IEEE Electron Device Letters, Jul. 1999, vol. 20, No. 7, pp. 354-356.
Vathulya, Vickram et al., "Characterization of Channel Mobility of Implanted SiC to Determine Polytype Suitability for the Power DIMOS Structure", Powerpoint Presentation at Lehigh University, Presented: 2000, 26 total slides, 13 pages.
Wang, Xiewen W. et al., "High Temperature Characteristics of High-Quality SiC MIS Capacitors with O/N/O Gate Dielectric", IEEE Transactions on Electron Devices, Feb. 2000, vol. 47, No. 2, pp. 450-462.
Wang, Y. et al., "Accumulation-Mode SiC Power MOSFET Design Issues", Material Science Forum, Published: 2000, vols. 338-342, pp. 1287-1290.
Wang, "High Barrier Heigh GaN Schottky Diodes: Pt/GaN and Pd/GaN," Applied Phys. Letters, vol. 68, No. 9, Feb. 26, 1996, pp. 1267-1269.
Wilamoski, "Schottky Diodes with High Breakdown Voltages," Solid-State Electronics, vol. 26, No. 5, Published: 1983, pp. 491-493.
Williams, J.R. et al., "Passivation of the 4H-SiC/SiO2 Interface with Nitric Oxide", Materials Science Forum, Copyright: 2002, vols. 389-393, pp. 967-972.
Xu, J.P. et al., "Improved Performance and Reliability of N2O-Grown Oxynitride on 6H-SiC", IEEE Electron Device Letters, Jun. 2000, vol. 21, No. 6, pp. 298-300.
Yilmaz, Hamza, "Optimization and Surface Charge Sensitivity of High Voltage Blocking Structures with Shallow Junctions", IEEE Transactions on Electron Devices, Jul. 1991, vol. 38, No. 7, pp. 1666-1675.
Zhang, Qingchun at al., "A 10-K Monolithic Darlington Transistor with βforced of 336 in 4H-SiC", Feb. 2009, IEEE Electron Device Letters, vol. 30, No. 2, pp. 142-144.
Zhang, Qingchun et al., "12 Kv 4H-SiC p-IGBTs with Record Low Specific On-Resistance", Materials Science Forum, Published: 2007, vols. 600-603, 4 pages.
Zhang, Qingchun et al., "Design and Fabrications of High Voltage IGBTs on 4H-SiC", Power semiconductor devices and IC's, 2006 IEEE International Symposium, Jun. 4-8, 2006, 4 pages.
Non-final Office Action for U.S. Appl. No. 13/229,749 mailed Jan. 25, 2013, 29 pages.
Final Office Action for U.S. Appl. No. 13/229,749, mailed Jun. 10, 2013, 33 pages.
Non-final Office Action for U.S. Appl. No. 13/229,750 mailed Oct. 2, 2012, 15 pages.
Notice of Allowance for U.S. Appl. No. 13/229,750 mailed Jan. 31, 2013, 7 pages.
Notice of Allowance for U.S. Appl. No. 13/229,750, mailed May 14, 2013, 8 pages.
Non-final Office Action for U.S. Appl. No. 13/229,752 mailed Mar. 21, 2013, 17 pages.
Non-Final Office Action for U.S. Appl. No. 12/719,412, mailed Jan. 7, 2013, 20 pages.
Restriction Requirement for U.S. Appl. No. 12/124,341, mailed Jul. 13, 2010, 6 pages.
Non-Final Office Action for U.S. Appl. No. 12/124,341, mailed Oct. 18, 2010, 7 pages.
Final Office Action for U.S. Appl. No. 12/124,341, mailed Jun. 21, 2011, 8 pages.
Notice of Allowance for U.S. Appl. No. 12/124,341, mailed Apr. 9, 2012, 8 pages.
China Patent Office Action for Chinese Patent Application No. 2007800294605, mailed Jan. 22, 2010, 7 pages.
European Search Report for European Patent Application No. 07112298.0, mailed Jan. 16, 2012, 7 pages.
European Search Report for European Patent Application No. 09177558.5, mailed Feb. 22, 2010, 6 pages.
European Search Report for European Patent Application No. 07120038.0, mailed Jun. 16, 2008, 7 pages.
European Search Report for European Patent Application No. 09163424.6, mailed Apr. 9, 2010, 10 pages.
Extended European Search Report for European Patent Application No. 07112298.0, mailed Feb. 18, 2009, 12 pages.
European Search Report for European Patent Application No. 09750952.5-1235, mailed Mar. 8, 2010, 5 pages.
International Preliminary Report on Patentability for International Application No. PCT/US2010/035709, mailed on Dec. 15, 2011, 8 pages.

(56) References Cited

OTHER PUBLICATIONS

International Preliminary Report on Patentability for International Application No. PCT/US2010/035713, mailed on Dec. 15, 2011, 8 pages.
International Preliminary Report on Patentability for International Application No. PCT/US2011/031150, mailed on Oct. 26, 2012, 8 pages.
International Preliminary Report on Patentability for International Patent Application No. PCT/US2009/003089, mailed Nov. 23, 2010, 7 pages.
International Search Report for International Patent Application No. PCT/US/01/30715 mailed Jun. 5, 2002, 9 pages.
International Search Report for International Patent Application No. PCT/US/01/42414, mailed Apr. 23, 2002, 10 pages.
International Search Report for International Patent Application No. PCT/US/02/11691, mailed Dec. 17, 2002, 9 pages.
International Search Report for International Patent Application No. PCT/US2004/004982 mailed Jul. 22, 2004, 13 pages.
International Search Report for International Patent Application No. PCT/US2011/027383, mailed May 20, 2011, 8 pages.
International Search Report for International Patent Application No. PCT/US2011/027383, mailed Sep. 20, 2012, 7 pages.
International Search Report for International Patent Application No. PCT/US2010/025053, mailed Jul. 2, 2010, 18 pages.
International Search Report for PCT/US2012/054091 mailed Dec. 5, 2012, 12 pages.
International Search Report for PCT/US2012/054092 mailed Dec. 5, 2012, 12 pages.
International Search Report for /US2012/054093 mailed Dec. 5, 2012, 12 pages.
International Search Report for US Patent Application No. 2007/0014139, mailed Feb. 4, 2008, 15 pages.
International Search Report for US Patent Application No. 2008/0008574, mailed Sep. 26, 2008, 15 pages.
International Search Report for US Patent Application No. 2008/0010538, mailed Dec. 22, 2008, 13 pages.
International Search Report for US Patent Application No. 2009/0000734, mailed Apr. 23, 2009, 13 pages.
International Search Report for Patent Application No. PCT/2012/27874, mailed Jul. 13, 2012, 7 pages.
International Search Report for US Patent Application No. 2009/0065251, mailed Jun. 1, 2010, 14 pages.
International Search Report for US Patent Application No. 2010/0020071, mailed Mar. 26, 2010, 14 pages.
International Search Report for US Patent Application No. 2010/0025053, mailed Feb. 7, 2010, 17 pages.
International Search Report for US Patent Application No. 2010/0025053, mailed May 3, 2010, 7 pages.
International Search Report for US Patent Application No. PCT/US2008/0004239, mailed Feb. 3, 2009, 14 pages.
Invitation to Pay Additional Fee for US Patent Application No. 2007/0010192, mailed Oct. 29, 2007, 10 pages.
Notice of Transmittal of International Search Report and Written Opinion for PCT/US2008/004239, mailed Mar. 2, 2009, 14 pages.
Notice of Transmittal of International Search Report for US Patent Application No. 2010/0026632, mailed Oct. 8, 2010, 16 pages.
Notice of Transmittal of International Search Report for US Patent Application No. 2010/0028612, mailed Jun. 17, 2010, 10 pages.
Notice of Transmittal of International Search Report for US Patent Application No. 2010/0035713, mailed Jul. 27, 2010, 14 pages.
Notice of Transmittal of International Search Report for US Patent Application No. 2010/0042075, mailed Sep. 24, 2010, 15 pages.
Notification Concerning Transmittal of International Preliminary Report on Patentability for International Application No. PCT/US2011/027383, mailed Sep. 20, 2012, 7 pages.
International Preliminary Report on Patentability for US Patent Application No. 2007/0010192, mailed Sep. 23, 2008, 9 pages.
Japanese Office Action for Japanese Patent Application No. 2011-510504, mailed Apr. 26, 2013, 8 pages.
Final Office Action for U.S. Appl. No. 12/719,412, mailed Jul. 31, 2013, 19 pages.
International Search Report and Written Opinion (16 pages) corresponding to International Application No. PCT/US2009/003089; Mailing Date: Aug. 20, 2009.
Fisher, C.A. et al., "The performance of high-voltage field relieved Schottky barrier diodes", IEE Proceedings, vol. 132:6, Pt. I, pp. 257-260 (Dec. 1985).
International Preliminary Report on Patentability for corresponding application PCT/US2009/003089 dated Nov. 23, 2010.
European Communication Corresponding to European Application No. 07 112 298.0; Dated: Jan. 16, 2012; 7 pages.
European Communication Corresponding to European Application No. 09750952.5-1235; Date of Notification: Mar. 8, 2012; 5 pages.
Notice of Allowance for U.S. Appl. No. 13/229,749, mailed Aug. 20, 2013, 9 pages.
Notice of Allowance for U.S. Appl. No. 13/229,750, mailed Aug. 23, 2013, 8 pages.
Final Office Action for U.S. Appl. 13/229,752, mailed Jul. 29, 2013, 6 pages.
Notice of Allowance for U.S. Appl. No. 13/229,752, mailed Oct. 10, 2013, 10 pages.
Advisory Action for U.S. Appl. No. 12/719,412, mailed Oct. 15, 2013, 3 pages.
Notice of Allowance for U.S. Appl. No. 13/229,749, mailed Oct. 28, 2013, 11 pages.

* cited by examiner

JUNCTION BARRIER SCHOTTKY DIODES WITH CURRENT SURGE CAPABILITY

CLAIM OF PRIORITY

The present application is a continuation of U.S. patent application Ser. No. 12/124,341, filed May 21, 2008, now U.S. Pat. No. 8,232,558 which is assigned to the assignees of the present application, the disclosure of which is hereby incorporated herein by reference as if set forth fully.

FIELD OF THE INVENTION

The present invention relates to semiconductor devices and the fabrication of semiconductor devices and more particularly, to Junction Barrier Schottky (JBS) diodes, and the fabrication of such diodes.

BACKGROUND

High voltage silicon carbide (SiC) Schottky diodes, which may have voltage blocking ratings between, for example, about 600V and about 2.5 kV, are expected to compete with silicon PIN diodes having similar voltage ratings. Such diodes may handle as much as about 100 amps or more of forward current, depending on their active area design. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based Schottky devices are theoretically capable of much higher switching speeds, for example, in excess of about 100 times better than silicon. In addition, silicon carbide devices may be capable of handling a higher current density than silicon devices.

A conventional SiC Schottky diode structure has an n-type SiC substrate on which an n–epitaxial layer, which functions as a drift region, is formed. The device typically includes a Schottky contact formed directly on the n– layer. A junction termination region, such as a guard ring and/or p-type JTE (junction termination extension) region, is typically formed to surround the Schottky junction active region. The purpose of junction termination region is to reduce or prevent electric field crowding at the edges of the Schottky junction, and to reduce or prevent the depletion region from interacting with the surface of the device. Surface effects may cause the depletion region to spread unevenly, which may adversely affect the breakdown voltage of the device. Other termination techniques include field plates and floating field rings that may be more strongly influenced by surface effects. A channel stop region may also be formed by implantation of n-type dopants in order to prevent the depletion region from extending to the edge of the device.

Regardless of the type of termination used, the Schottky diode will typically fail if a large enough reverse voltage is applied to the junction. Such failures are generally catastrophic, and may damage or destroy the device. Furthermore, even before the junction has failed, a Schottky diode may experience large reverse leakage currents. In order to reduce such leakage currents, the junction barrier Schottky (JBS) diode was developed. JBS diodes are sometimes referred to as Merged PIN-Schottky (MPS) diodes. A conventional JBS diode 10 is illustrated in FIG. 1. As shown therein, a conventional JBS diode includes an n-type substrate 12 on which an n– drift layer 14 is formed. A plurality of p+ regions 16 are formed, typically by ion implantation, in the surface of the n– drift layer 14. A metal anode contact 18 is formed on the surface of the n– drift layer 14 in contact with both the n– drift layer 14 and the p+ regions 16. The anode contact 18 forms a Schottky junction with the exposed portions of the drift layer 14, and may form an ohmic contact with the p+ regions 16. A cathode contact 20 is formed on the substrate 12. Silicon carbide-based JBS diodes are described, for example, in U.S. Pat. Nos. 6,104,043 and 6,524,900.

In forward operation, the junction J1 between the anode contact 18 and the drift layer 14 turns on before the junction J2 between the p+ regions 16 and the drift layer 14. Thus, at low forward voltages, the device exhibits Schottky diode behavior. That is, current transport in the device is dominated by majority carriers (electrons) injected across the Schottky junction J1 at low forward voltages. As there may be no minority carrier injection (and thus no minority charge storage) in the device at normal operating voltages, JBS diodes have fast switching speeds characteristic of Schottky diodes.

Under reverse bias conditions, however, the depletion regions formed by the PN junctions J2 between the p+ regions 16 and the drift layer 14 expand to block reverse current through the device 10, protecting the Schottky junction J1 and limiting reverse leakage current in the device 10. Thus, in reverse bias, the JBS diode 10 behaves like a PIN diode. The voltage blocking ability of the device 10 is typically determined by the thickness and doping of the drift layer 14 and the design of the edge termination.

One problem commonly encountered with silicon carbide JBS diodes is their ability to handle current surges. Silicon carbide JBS Schottky diodes are typically designed for use in power switching applications, such as power factor control (PFC) in high voltage distribution systems. In such applications, surge currents can be experienced during power on and/or after line cycle dropouts. When a current surge occurs, substantial power can be dissipated in the diode, which can result in catastrophic failure of the device due to thermal runaway.

A JBS Schottky diode can be designed so that the junction J2 between the p+ regions 16 and the drift layer 14 turns on under high current conditions, resulting in an injection of minority carriers (holes) across the junction J2 into the drift layer 14. This injection of minority carriers modulates the conductivity of the drift layer 14, reducing the resistance to current and therefore reducing the potential for failure of the device as a result of the current surge. However, designing the p+ regions 16 so that the junction J2 turns on at high currents can undesirably increase the on-state resistance of the device at lower currents.

SUMMARY

An electronic device according to some embodiments includes a silicon carbide drift region having a first conductivity type, a Schottky contact on the drift region, and a plurality of junction barrier Schottky (JBS) regions at a surface of the drift region adjacent the Schottky contact. The JBS regions have a second conductivity type opposite the first conductivity type and have a first width and a first spacing between adjacent ones of the JBS regions. The device further includes a surge protection region at the surface of the drift region adjacent the Schottky contact. The surge protection region has a second width greater than the first width and includes a plurality of surge protection subregions having the second conductivity type. Each of the surge protection subregions has a third width less than the first width and has a second spacing between adjacent ones of the surge protection subregions that may be less than the first spacing between adjacent ones of the JBS regions.

The first spacing may be about 4 μm to about 6 μm and the second spacing may be about 1 μm to about 3 μm. The first width may be about 1 μm to about 3 μm and the third width may be about 1 μm to about 3 μm.

The surge protection subregions may extend into the drift layer from the surface of the drift layer by a depth of about 0.3 μm to about 0.5 μm. A doping level of the drift region may be about $5\times10^{14}$ cm$^{-3}$ to about $1\times10^{16}$ cm$^{-3}$.

The first spacing, the second spacing and the third width are configured such that a voltage drop from a surface of the drift layer to a center of a junction between one of the surge protection subregions and the drift region may be sufficient to cause the junction to become forward biased at a forward current that is higher than a rated current of the Schottky diode so as to provide a current surge handling ability in the Schottky diode.

An interface between the Schottky contact and the surge protection subregions may be an ohmic contact.

The drift layer may include 4H—SiC. The drift layer may have a doping level of about $5\times10^{15}$ cm$^{-3}$ to $1\times10^{16}$ cm$^{-3}$, and the current surge control subregions may have a doping level greater than $5\times10^{18}$ cm$^{-3}$.

A portion of the drift region beneath the surge protection regions may have a higher electric potential than a portion of the drift region beneath the JBS regions in response to a forward voltage applied to the Schottky contact.

The device may further include a plurality of current surge control regions in the drift layer adjacent the Schottky contact.

The first conductivity type may include n-type and the second conductivity type may include p-type.

The surge control subregions include a plurality of trenches in the drift region and a plurality of doped regions in the drift layer extending beneath respective ones of the plurality of trenches.

The surge protection subregions may define vertical current paths in the drift region between respective ones of the surge protection subregions, a depth of the surge protection regions may be defined by a depth of the trenches and a depth of the doped regions.

Methods of forming a Schottky diode according to some embodiments include forming a plurality of junction barrier Schottky (JBS) regions at a surface of a silicon carbide drift region having a first conductivity type, the plurality of JBS regions having a second conductivity type opposite the first conductivity type and having a first spacing between adjacent ones of the JBS regions. The methods further include forming a surge protection region at the surface of the drift region adjacent the Schottky contact, the surge protection region including a plurality of surge protection subregions having the second conductivity type and each of the surge protection subregions having a second spacing between adjacent ones of the surge protection subregions that may be less than the first spacing between adjacent ones of the JBS regions. A Schottky contact is formed on the drift region.

The first spacing may be about 4 μm to about 6 μm and the second spacing may be about 1 μm to about 3 μm.

Forming the plurality of JBS regions and forming the surge protection region may include selectively implanting dopant ions of the second conductivity into the drift layer, and annealing the implanted ions at a temperature greater than 1700° C.

The methods may further include forming a graphite coating on the drift layer including the implanted ions, annealing the implanted ions may include annealing the graphite coating.

The methods may further include etching a plurality of trenches in the drift layer before implanting the ions, implanting the ions may include implanting the ions into the plurality of trenches.

Forming the Schottky contact on the drift region may include forming the Schottky contact to the drift region and an ohmic contact to the surge protection subregions using a single metal.

An electronic device according to further embodiments includes a silicon carbide drift region having a first conductivity type, a Schottky contact on the drift region, and a plurality of junction barrier Schottky (JBS) regions at a surface of the drift region adjacent the Schottky contact. The plurality of JBS regions have a second conductivity type opposite the first conductivity type and have a first spacing between adjacent ones of the JBS regions. The device further includes a plurality of surge protection subregions having the second conductivity type. Each of the surge protection subregions has a second spacing between adjacent ones of the surge protection subregions that is less than the first spacing.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
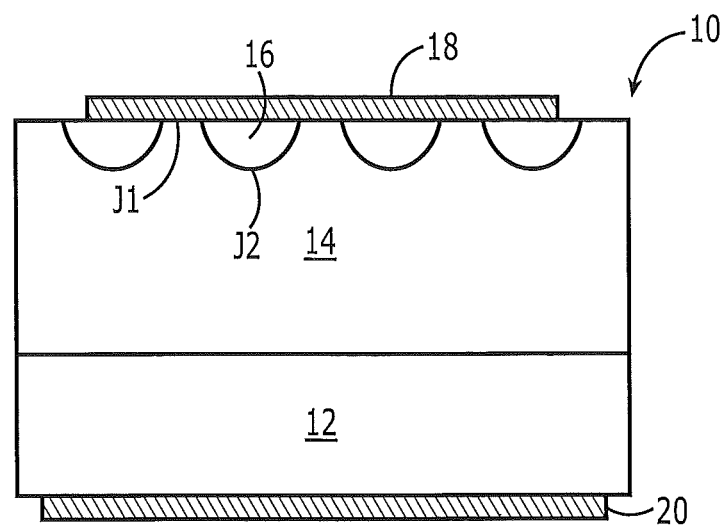
FIG. 1 is a cross-sectional view of a conventional JBS diode.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Figure 2:
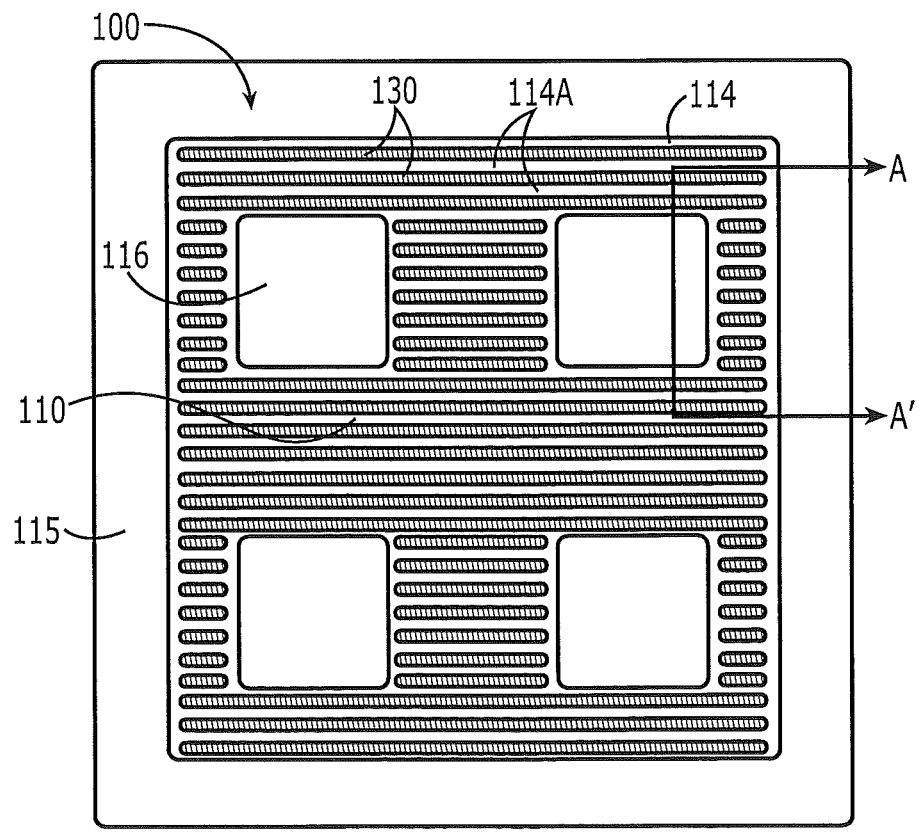
FIG. 2 is a top view of a JBS diode including surge protection regions.

FIG. 2 is a top view of a Schottky diode structure 100 in which current surges are handled by sizing and doping the p+ regions so that they will turn on at high current densities and inject minority carriers into the drift layer 14. Similar diodes are disclosed in U.S. Publication No. 2008/0029838 entitled "Semiconductor Devices Including Schottky Diodes With Controlled Breakdown And Methods Of Fabricating Same", which is assigned to the assignee of the present invention, the disclosure of which is incorporated herein by reference.

Referring to FIG. 2, the diode 100 includes a drift layer 114 having an upper surface in which a plurality of JBS regions 130 of opposite conductivity type from the drift layer 114 are formed as stripe-shaped regions in the drift layer 114. The JBS regions 130 may be formed, for example, by ion implantation of p-type dopants such as boron and/or aluminum into the drift layer 114 at a concentration of about $1 \times 10^{17}$ to about $1 \times 10^{18}$ cm$^{-3}$, and may extend to a depth of about 0.3 to about 0.5 µm beneath the surface of the drift layer 114.

One or more surge protection regions 116 is also provided in the drift layer 114. The surge protection regions 116 may be formed, for example, by ion implantation of p-type dopants such as boron and/or aluminum into the drift layer 114 at a concentration of about $1 \times 10^{18}$ to about $1 \times 10^{19}$ cm$^{-3}$, and may extend to a depth of about 0.3 to about 0.5 µm beneath the surface of the drift layer 114.

The JBS regions 130 expose portions 114A of the surface of the drift layer 114 and that extend across an active region 110 of the drift layer 114 (except for the exposed portions 114A of the drift layer and the heavily doped regions 116). A metal Schottky contact 118 (FIG. 3) covers the drift layer 114 and is in contact with the exposed portions 114A of the drift layer 114 as well as the JBS regions 130 and the surge protection regions 116. As used herein, the term "active region" refers to the two dimensional area of the device in which the Schottky metal contacts the drift layer and includes the exposed portions 114A of the drift layer 114, the JBS regions 130 and the surge protection regions 116. Accordingly, the active region includes the Schottky junction area but does not include, for example, the edge termination region.

Figure 3:
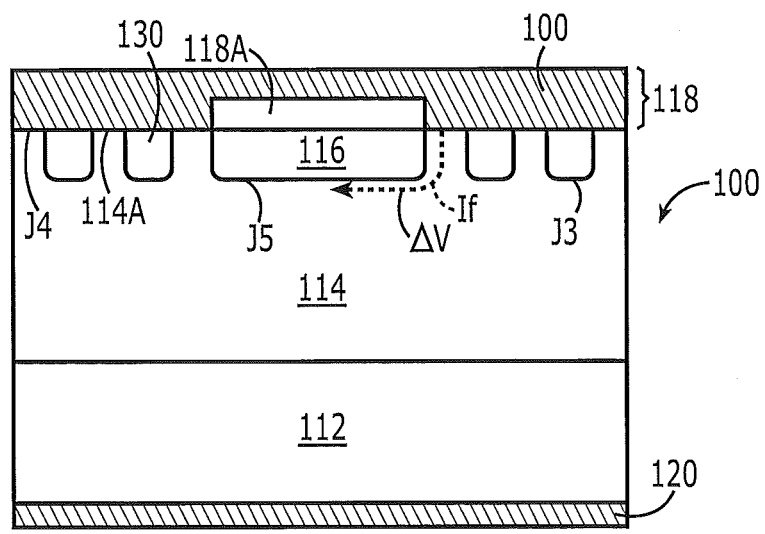
FIG. 3 is a cross-sectional view of a JBS diode including a surge protection region.

FIG. 3 is a cross-sectional illustration of the diode 100 taken generally along lines A-A' of FIG. 2. As seen in FIG. 3, the diode 100 includes a substrate 112 on which the drift layer 114 is formed. The surge protection regions 116 may be formed as an implanted region within the drift layer 114. Similarly, the JBS regions 130 may be formed as implanted regions in the drift layer 114. As the surge protection regions 116 and the JBS regions 130 have an opposite conductivity type from the drift layer 114, the JBS regions 130 form a p-n junction J3 with the drift layer 114, while the heavily doped regions 116 form a p-n junction J5 with the drift layer 114.

An anode contact 118 on the surface of the drift layer 114 forms a Schottky junction J4 with the exposed portions 114A of the drift layer 114 between adjacent lightly doped regions 130 and/or between a JBS region 130 and the surge protection region 116. The anode contact 118 may include a metal, such as aluminum, titanium and/or nickel, that may form an ohmic contact with the surge protection region 116, while forming a Schottky contact with the drift layer 114. As illustrated in FIG. 3, the anode contact 118 can include a first portion 118A that forms an ohmic contact on the surge protection region 116 and a second portion 118B that forms a Schottky contact with the drift layer 114. In particular, the second portion 118B may be formed to cover the first portion 118A of the anode contact 118. The first portion 118A may include, for example, aluminum, titanium and/or nickel, while the second portion 118B may include, for example, aluminum, titanium and/or nickel.

A cathode contact 120 is formed on a side of the substrate 112 opposite the drift layer 114. The cathode contact 120 may include a metal, such as nickel, that is capable of forming an ohmic contact to n-type silicon carbide.

In forward operation, the junction J4 between the anode contact 118 and the exposed portions 114A of the drift layer 114 turns on before the junction J5 between the surge protection region 116 and the drift layer 114. Thus, at low forward voltages, the device exhibits Schottky diode behavior. That is, at low forward voltages, the operation of the diode 100 is dominated by the injection of majority carriers across the Schottky junction J4. Due to the absence of minority carrier injection under normal operating conditions, the diode 100 may have a very fast switching capability, which is characteristic of Schottky diodes in general.

The surge protection region 116 may be designed to begin to conduct at a forward voltage that is higher than the turn-on voltage of the Schottky junction J4. Thus, in the event of a current surge that causes the forward voltage of the diode 100 to increase, the p-n junction J5 will begin to conduct. Once the p-n junction J5 begins to conduct, the operation of the diode 100 becomes dominated by the injection and recombination of minority carriers across the p-n junction J5. In that case, the on-state resistance of the diode may decrease, which may decrease the amount of power dissipated by the diode 100 for a given level of current. Thus, turn-on of the p-n junction J5 when the forward voltage of the diode 100 increases may reduce and/or prevent forward current runaway in the diode 100.

In forward operation, a forward current If flows vertically downward adjacent the JBS regions 130 and the surge protection region 116. Current also flows horizontally across the face of the surge protection region 116. Turn-on of the p-n junction J5 occurs when a voltage drop ☐V from the surface 114A of the drift region to the middle of the surge protection region 116 exceeds the built-in voltage of the p-n junction J5. Thus, for a given level of doping in the drift region 114, the surge protection region 116 may be designed to have at least a minimum lateral width (or minimum extent) to cause the p-n junction J5 to turn on at a desired turn-on level of the forward current If.

Some embodiments of the invention arise from a realization that the desired voltage drop can be obtained by methods other than simply increasing the lateral width of the surge protection region 116, which can undesirably increase the on-state resistance of the device 100.

Figure 4:
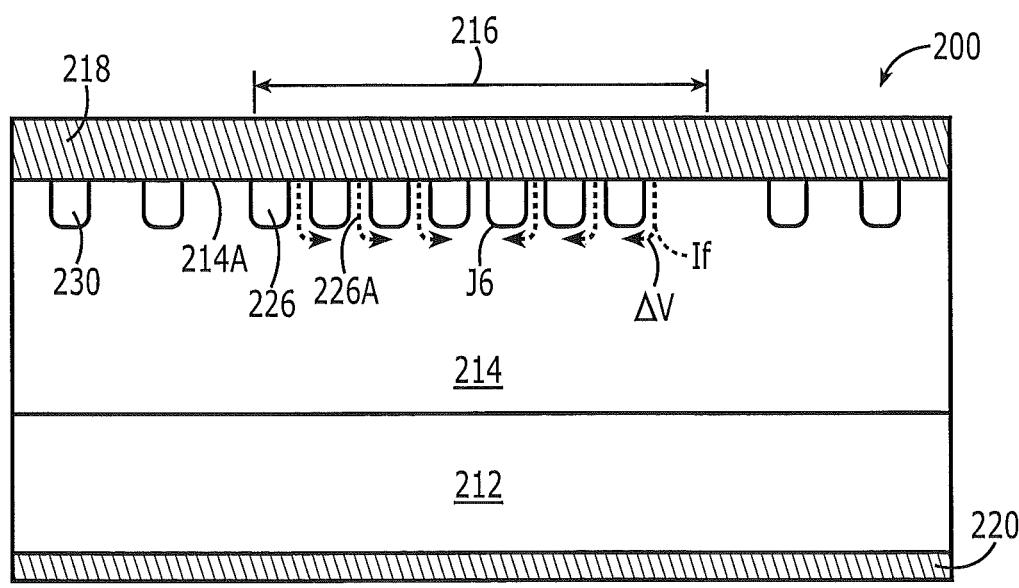
FIG. 4 is a cross-sectional view of a JBS diode according to some embodiments.

For example, FIG. 4 illustrates embodiments in which a surge protection region 216 is formed using a plurality of subregions 226 having a defined depth, width, spacing and doping to provide both reverse bias protection as well as surge current protection.

In particular, FIG. 4 is a cross-sectional view of a diode 200 according to some embodiments of the invention. The diode 200 includes a drift layer 214 having an upper surface in which a plurality of JBS regions 230 of opposite conductivity type from the drift layer 214 are formed.

The drift layer 214 may be formed, for example, from n-type silicon carbide of the 2H, 4H, 6H, 3C and/or 15R polytype having a dopant concentration of about $5 \times 10^{14}$ to about $1 \times 10^{16}$ cm$^{-3}$, depending on design requirements for voltage blocking and on-resistance for the diode 200. Other types of semiconductor materials, such as GaN, GaAs, silicon or germanium may be used. In particular embodiments, the drift layer 214 includes 4H—SiC doped with n-type dopants at a concentration of about $5 \times 10^{15}$ cm$^{-3}$. The JBS regions 230 may be formed, for example, by ion implantation of p-type dopants such as boron and/or aluminum into the drift layer 214 at a concentration of about $1 \times 10^{18}$ cm$^{-3}$ to $1 \times 10^{19}$ cm$^{-3}$, and may extend to a depth of about 0.3 to about 0.5 μm beneath the surface of the drift layer 214. In particular embodiments, the JBS regions 230 may be doped with p-type dopants at a concentration of about $5 \times 10^{18}$ cm$^{-3}$.

The surge protection region 216 includes a plurality of subregions 226 in the drift layer 214. The subregions 226 may be formed, for example, by ion implantation of p-type dopants such as boron and/or aluminum into the drift layer 214 at a concentration of about $1 \times 10^{18}$ to about $1 \times 10^{19}$ cm$^{-3}$, and may extend to a depth of about 0.3 to about 0.5 μm beneath the surface of the drift layer 114. In particular embodiments, the subregions 116 may be doped at a dopant concentration of about $5 \times 10^{18}$ cm$^{-3}$, and may extend to a depth of about 0.5 μm beneath the surface of the drift layer 214. Each of the subregions 226 forms a p-n junction J6 with the drift region 214. In some embodiments, the subregions 226 can be implanted at the same time as the JBS regions 230. Accordingly, the subregions 226 can have the same depth and doping profile as the JBS regions 230. However, in other embodiments, the subregions 226 can be formed in a different process than the JBS regions 230 and can have a different depth and/or doping profile than the JBS regions 230.

Activation of the implanted dopants in the JBS regions 230 and the subregions 226 can be performed by annealing the structure including the substrate 212, the drift layer 214 and the implanted regions at a sufficiently high temperature. In some embodiments, a graphite coating may be formed on the surface of the drift region 214 prior to implant activation. The graphite coating may be removed after annealing the implanted ions. The graphite coating may be crystallized before annealing the implanted ions.

The implanted ions may be annealed at a temperature greater than 1700° C., and in some embodiments greater than 1800° C.

Figure 6:
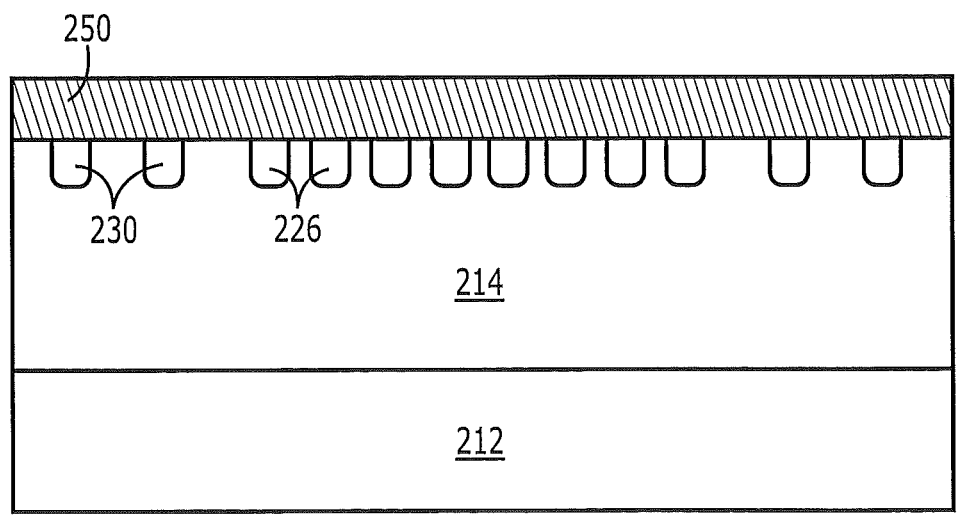
FIG. 6 is a cross-sectional view of an intermediate structure formed during fabrication of a JBS diode according to some embodiments.

For example, referring to FIG. 6, the implanted dopants in the JBS regions 230 and the subregions 226 may be activated by annealing the structure at a temperature of about 1600° C.

or more with a silicon over pressure and/or covered by an encapsulation layer such as a graphite film. In some embodiments, the implants may be activated by annealing at a temperature greater than about 1700° C. using a graphite coating.

A high temperature activation anneal (e.g. 1700° C. or more) may enhance the activation of the threshold adjustment ions, as well as annealing of defects in the channel region 40. However, such a high temperature anneal may damage the surface of the silicon carbide drift layer 16.

To reduce damage that may result from a high temperature anneal, a graphite coating 250 may be formed on the surface of the structure prior to formation of the metal contacts thereto. That is, prior to annealing the structure to activate the implanted ions, a graphite coating 250 may be applied to the top/front side of the drift layer 214 in order to protect the surface of the structure during the anneal. The graphite coating 250 may be applied by a conventional resist coating method and may have a thickness that is sufficient to protect the underlying SiC layers during a high temperature anneal. The graphite coating 250 may have a thickness of about 1 μm. Prior to the anneal, the graphite coating 250 may be heated to form a crystalline coating on the drift layer 214. The implanted ions may be activated by a thermal anneal that may be performed, for example, in an inert gas at a temperature of about 1700° C. or greater. In particular the thermal anneal may be performed at a temperature of about 1850° C. in argon for 5 minutes. The graphite coating 250 may help to protect the surface of the drift layer 214 during the high temperature anneal.

The graphite coating 250 may then be removed, for example, by ashing and thermal oxidation.

In addition to activating the implanted ions, a high temperature anneal with a graphite coating can facilitate the formation of an ohmic contact to the subregions 216. That is, without wishing to be bound by any particular theory of operation, it is presently believed that p-type dopants, such as Al ions, in the surge protection subregions 226 accumulate at the surface of the subregions 226 during a high temperature anneal. When a metal, such as titanium, is deposited onto the drift layer 214 as the anode contact 218, the metal may desirably form an ohmic contact with the underlying subregions 226. Forming an ohmic contact between the anode metal 218 and the subregions 226 may enhance the overcurrent protection provided by the surge protection region 216 by making it easier for the p-n junction J6 to turn on at the desired level of forward current. Furthermore, in some embodiments, it may be possible to use only a single metal for the anode contact that forms a Schottky contact to the drift region 214 as well as an ohmic contact to the subregions 226, which can reduce manufacturing time and/or expense.

The JBS regions 230 shown in the embodiments of FIG. 4 may be provided as spaced apart striped regions that expose portions 214A of the surface of the drift layer 214 and that extend across an active region of the drift layer 214 (except for the exposed portions 214A of the drift layer and the subregions 226). A metal Schottky contact 218 covers the drift layer 214 and is in contact with the exposed portions 214A of the drift layer 214 as well as the JBS regions 230 and the subregions 226.

The diode 200 may include an edge termination region (not shown) surrounding the active region 110 of the diode 100. The edge termination region may include a junction termination extension (JTE) region, field rings, field plates, guard rings, and/or a combination of the foregoing or other terminations.

A cathode contact 220 is formed on a side of the substrate 212 opposite the drift layer 214. The cathode contact 220 may include a metal, such as nickel, that is capable of forming an ohmic contact to n-type silicon carbide.

In forward operation, a forward current If flows vertically downward adjacent the JBS regions 230 and the subregions 226. Current also flows horizontally across the face of the surge protection regions 226. Turn-on of the p-n junction J6 between a subregion 226 and the drift layer 214 occurs when a voltage drop □V from the surface 214A of the drift region to the middle of the subregion 226 exceeds the built-in voltage of the p-n junction J6. However, a portion of the voltage drop □V can occur in the vertical current path 226A between adjacent subregions 226. The resistance of a vertical current path 226A is a function of the length and width of the vertical current path 226A and the surface doping of the drift region 214. Accordingly, some embodiments control the length and width of the vertical current path 226A as well as the surface doping of the drift region 214 so that bipolar conduction between the subregions 226 and the drift region 214 across the junction J6 occurs at a desired level of forward current.

Figure 5:
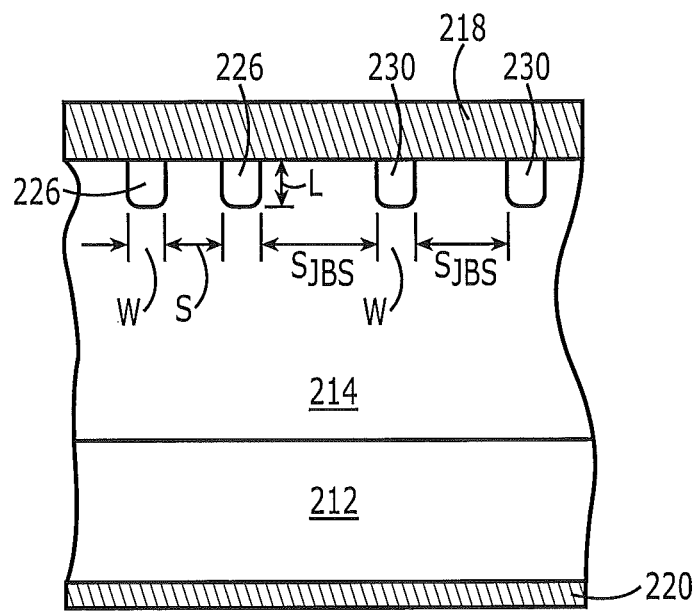
FIG. 5 is a detail view illustrating additional aspects of the JBS diode of FIG. 4.

Some further aspects of the diode 200 are shown in FIG. 5, which is a cross-sectional detail view of portions of the diode 200. In particular, as illustrated in FIG. 5, the subregions 226 may have a width W, a spacing S and a depth L. The JBS regions 230 may have a width $W_{JBS}$ and a spacing $S_{JBS}$. The JBS regions 230 may be spaced apart from the surge protection region 216 by the JBS spacing $S_{JBS}$. The resistance of the vertical current paths 226A between adjacent subregions 226 can be expressed as:

$$R = \rho \frac{L}{S} \quad (1)$$

That is, the resistance of the vertical current paths is proportional to the depth L of the subregions 226 and is inversely proportional to the spacing S between adjacent subregions 226. Accordingly, a desired voltage drop □V can be obtained by making the subregions 226 deeper and/or more closely spaced. Making the subregions 226 deeper may present a challenge due to the limits of ion implantation technology. In particular, using ion implantation alone, it may be difficult to form the subregions 226 to have a depth L of more than 0.5 μm. This limitation is addressed in further embodiments, described in detail below.

However, the spacing S between adjacent subregions 226 can be reduced through photolithography so that the resistance of the vertical current paths 226A can be increased to the point that conduction of the p-n junction J6 can begin at a desired level of forward current If.

In some embodiments, the depth L of the subregions 226 may be from 0.3 to 0.5 μm. The width W of the subregions 226 may be from about 1 μm to about 3 μm. The spacing S between adjacent subregions 226 may be from about 1 μm to about 3 μm. The width $W_{JBS}$ of the JBS regions 230 may be from about 1 μm to about 3 μm. The spacing $S_{JBS}$ between adjacent JBS regions 230 and/or between a JBS region 230 and the current surge region 216 may be from about 4 μm to about 6 μm, or about 2 to 4 times the spacing S between adjacent subregions 226. The width of the surge protection region 216 may be about 10 μm or more.

Figure 7A:
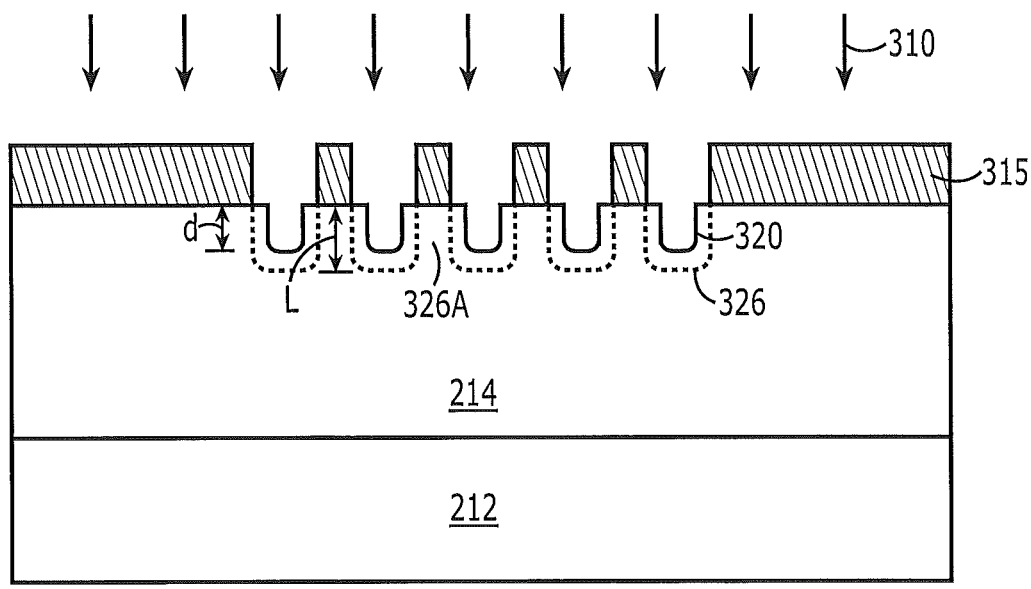
FIG. 7A is a cross-sectional view of an intermediate structure formed during fabrication of a JBS diode according to further embodiments.
Figure 7B:
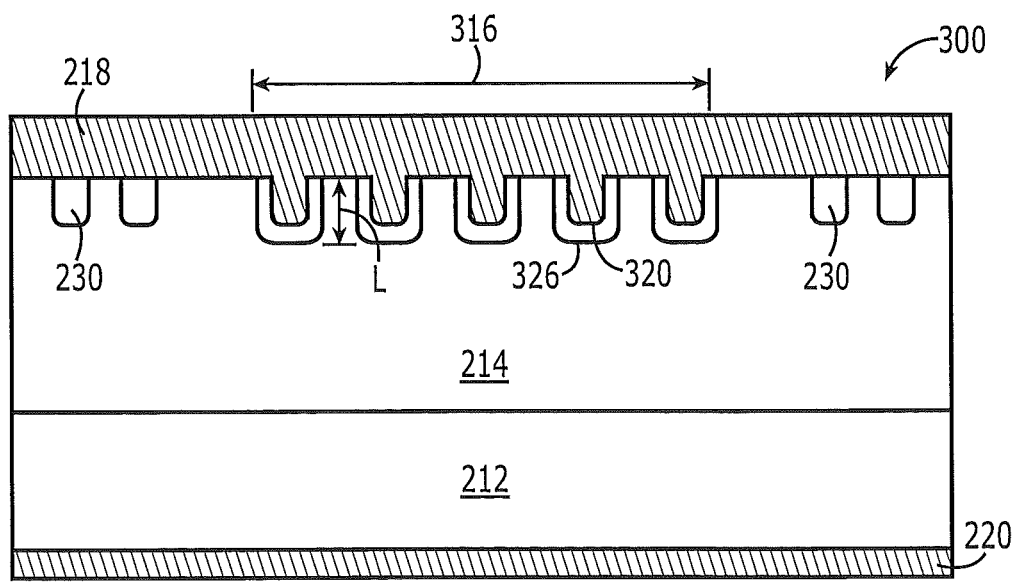
FIG. 7B is a cross-sectional view of a JBS diode according to further embodiments.

FIGS. 7A and 7B illustrate structures/methods according to further embodiments. As shown therein, subregions 326 of a surge protection region 316 can be formed by etching trenches 320 into the drift layer 214. The subregions 326 can be etched, for example, using a dry etch technique such as plasma etching, Inductively Coupled Plasma (ICP), Electron Cyclotron Resonance (ECR), etc., using a fluroine based chemistry such as $SF_6$, $CHF_3$, etc.

The trenches 320 can be etched to a depth d of from about 0.3 μm to about 1 μm. After trench formation, ions 310, for example, p-type ions such as aluminum and/or boron, can be implanted into the trenches 320 through an implant mask 315 to form the subregions 326. The ions can be implanted, for example, at a dose of $1 \times 10^{15}$ $cm^{-2}$, and an energy of up to 300 keV. The ions can be implanted with a tilt angle of 30° so that the sidewalls of the trenches 320 are implanted. Furthermore, the implantation can be performed at a temperature of 25° C. As will be appreciated, the depth L of the vertical channel 326A between adjacent subregions 326 is then the sum of the depth d of the trenches 320 and the junction depth of the implants. A longer vertical channel 326A with a correspondingly higher resistance can thereby be obtained.

Furthermore, the anode contact 218 can penetrate into the trenches 320 to form ohmic contacts to the subregions 326 with a larger surface area, and hence lower resistance. The resulting device 300, including an anode contact 220 on the substrate 212, is shown in FIG. 7B.

Figure 8A:
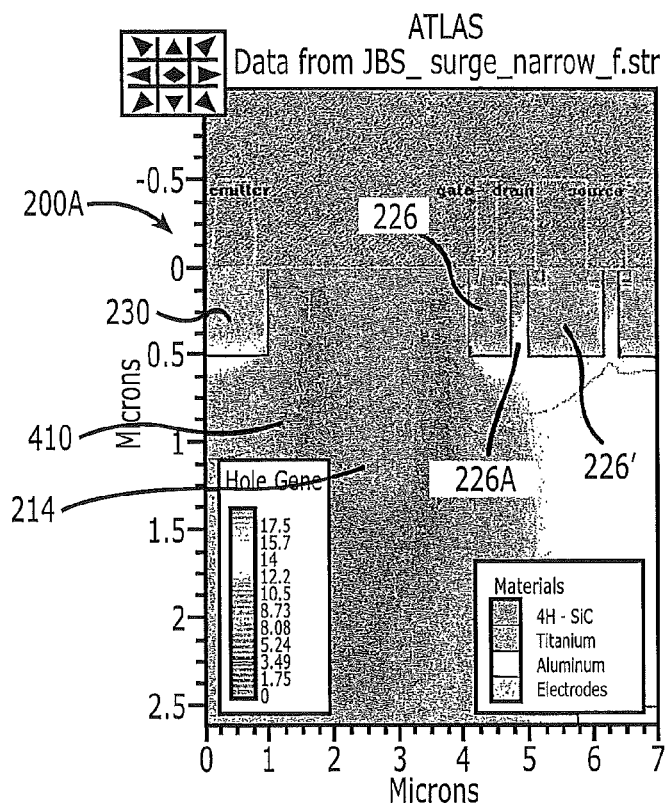
FIG. 8A illustrates a simulated device structure and simulation results for a device according to some embodiments.
Figure 8B:
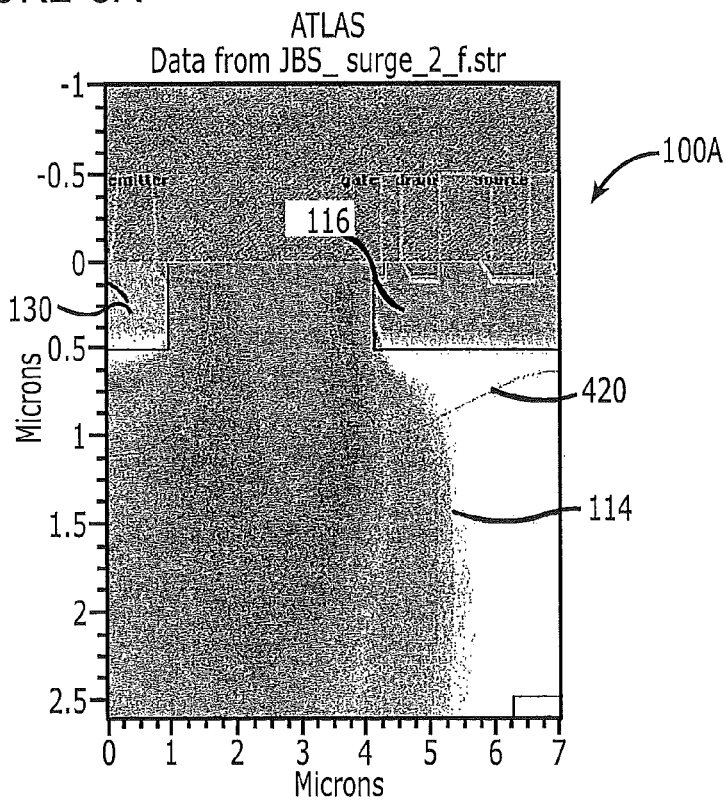
FIG. 8B illustrates a simulated device structure and simulation results for a comparison device.

FIGS. 8A and 8B illustrate simulation results for diodes similar to the diodes illustrated in FIGS. 4 and 3, respectively. In particular, FIGS. 8A and 8B graphically illustrate hole concentrations in the devices under surge current conditions at a forward voltage drop of 5.2V. For example, FIG. 8A illustrates a structure 200A including a drift region 214. A JBS region 230 and a plurality of surge protection subregions 226 are formed at a surface of the drift region 214. Vertical current paths 226A are defined between adjacent ones of the surge protection subregions 226. Also plotted in FIG. 8A is a line 410 that indicates the position of the depletion region boundary within the structure 200A. FIG. 8B illustrates a structure 100A including a drift region 114. A JBS region 130 and a single surge protection region 116 are formed at a surface of the drift region 114. The line 420 in FIG. 8B indicates the position of the depletion region boundary in the structure 100A.

As shown in FIGS. 8A and 8B, holes can be injected from the subregions 226 in the device 200A of FIG. 8A and from the surge protection region 116 in the device 100A of FIG. 8B. However, a higher hole concentration can be injected from the central subregion 226' in the device 200A in FIG. 8A than from the surge protection region 116 in the device 100A in FIG. 8B.

Figure 9:
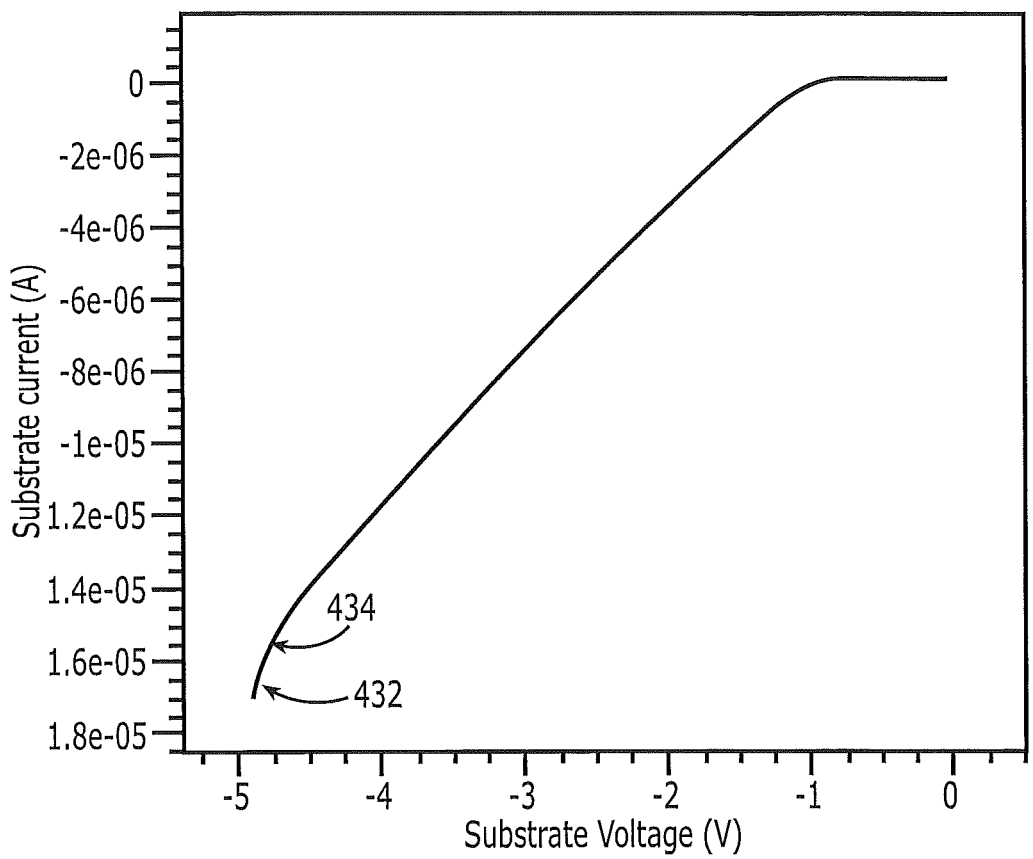
FIG. 9 illustrates simulated current versus voltage characteristics for a device according to some embodiments.

FIG. 9 illustrates simulated current versus voltage for the structures 200A and 100A shown in FIGS. 8A and 8B, respectively. In particular, FIG. 9 indicates that a current begins in both devices at a voltage of approximately 4.8V. However, the device 200A appears to have a lower resistance during surge current conditions than the device 100A, as indicated by a higher slope of the I-V curve at voltages exceeding 4.8V. It will be appreciated that in the simulation, the voltage was referenced from the cathode to the anode. Thus, forward bias and forward current were assigned negative polarities.

Figure 10:
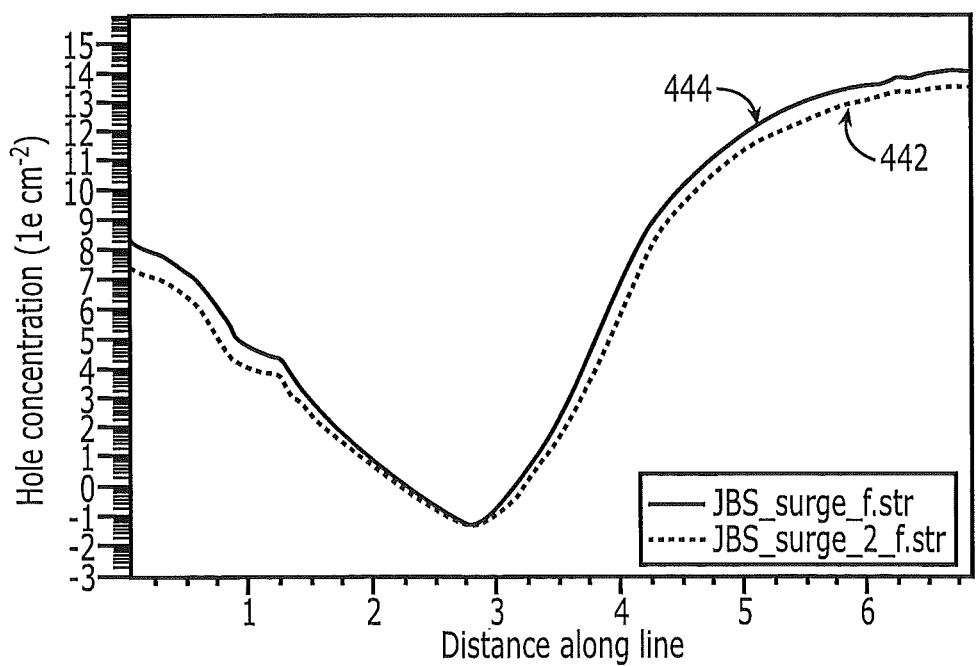
FIG. 10 illustrates simulated hole concentration characteristics for a device according to some embodiments.

FIG. 10 is a graph of simulated hole concentration versus lateral position in the devices 200A and 100A illustrated in FIGS. 8A and 8B, respectively. In particular, curve 442 shows the simulated hole concentration versus position for the device structure 100A of FIG. 8B, while curve 444 shows the simulated hole concentration versus position for the device structure 200A of FIG. 8A. The simulations predict higher hole concentrations for the device structure 200A of FIG. 8A.

Figure 11:
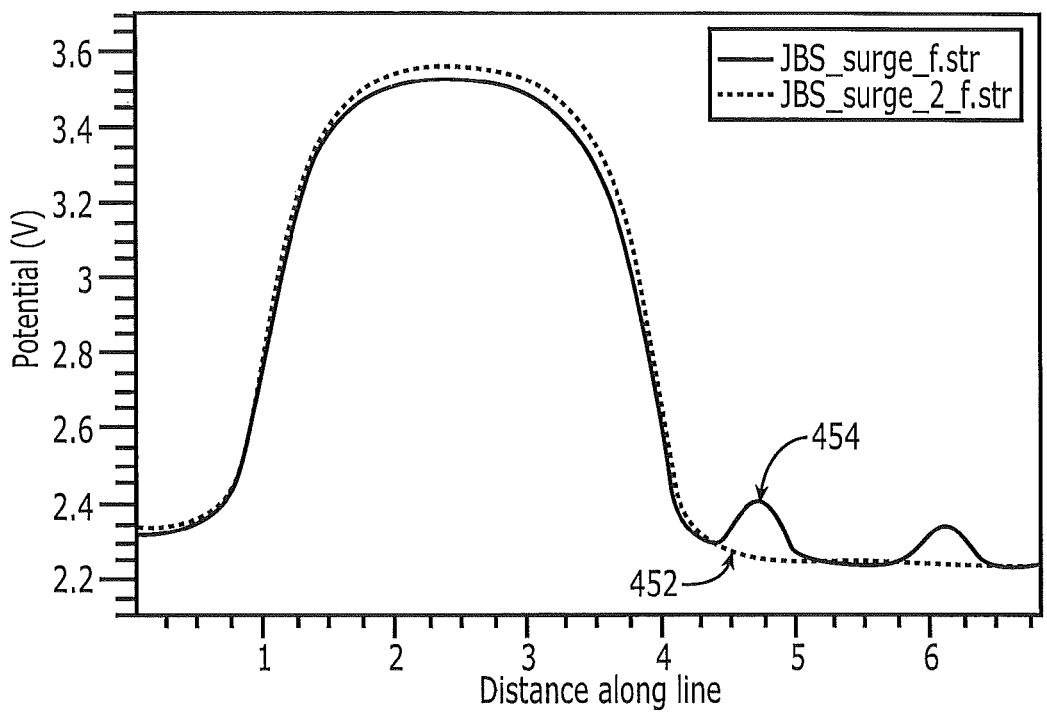
FIG. 11 illustrates simulated voltage potential characteristics for a device according to some embodiments.
Figure 12:
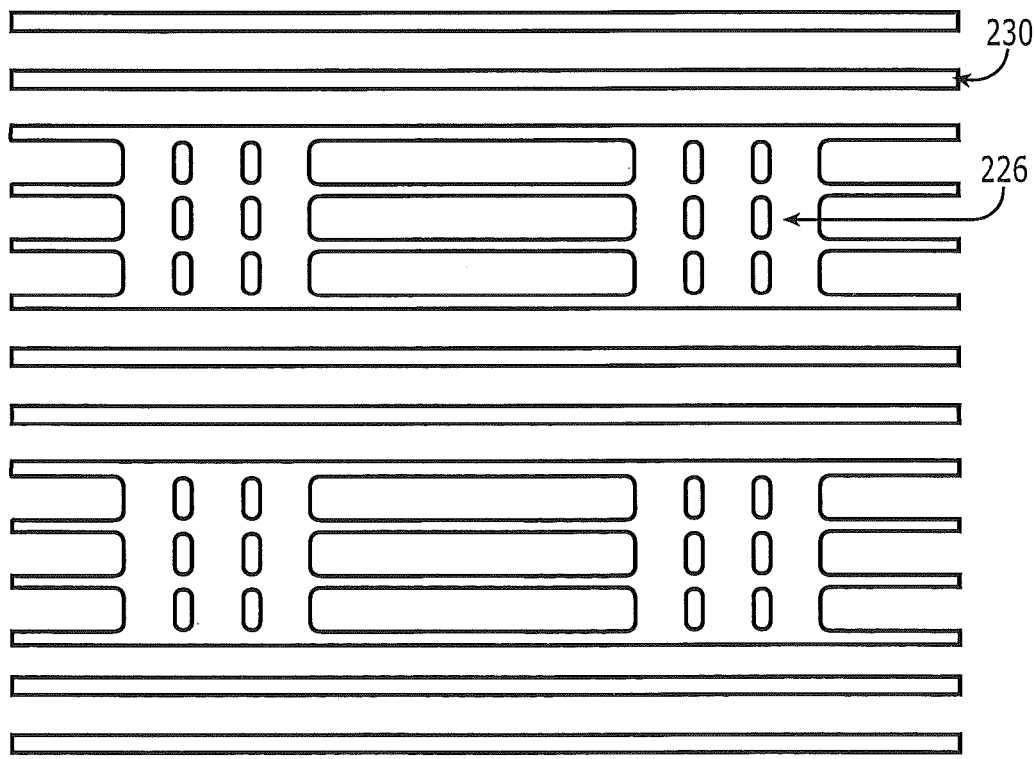
FIG. 12 illustrates an implantation mask pattern that can be used according to some embodiments.

FIG. 11 is a graph of simulated potential versus lateral position in the devices 200A and 100A illustrated in FIGS. 8A and 8B, respectively. In particular, curve 452 shows the simulated potential versus position for the device structure 100A of FIG. 8B, while curve 454 shows the simulated potential versus position for the device structure 200A of FIG. 8A. The simulations predict local increases in potential over the vertical current paths 226A between adjacent subregions 226 for the device structure 200A of FIG. 8A. Furthermore, in the device structure 200A, a portion of the drift region beneath the surge protection subregions 226 has a higher electric potential than a portion of the drift region beneath the JBS regions 230 in response to a forward voltage applied to the Schottky contact FIG. 12 illustrates an exemplary mask layout for the p-type implants that define the JBS regions 230 and the subregions 226 for the device 200 shown in FIG. 4.

While embodiments of the present invention have been described with reference to particular sequences of operations, as will be appreciated by those of skill in the art, certain operations within the sequence may be reordered while still benefiting from the teachings of the present invention. Accordingly, the present invention should not be construed as limited to the exact sequence of operations described herein.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A Schottky diode, comprising:
   a drift region having a first conductivity type;
   a Schottky contact on the drift region;
   a plurality of junction barrier Schottky (JBS) regions at a surface of the drift region adjacent the Schottky contact, the plurality of JBS regions having a second conductivity type opposite the first conductivity type; and
   a surge protection region at the surface of the drift region adjacent the Schottky contact, the surge protection region comprising a plurality of surge protection subregions having the second conductivity type;
   wherein the surge protection subregions are configured such that a voltage drop from a surface of the drift region to a center of a junction between one of the surge protection subregions and the drift region is sufficient to cause the junction to become forward biased at a forward current that is higher than a rated current of the Schottky diode so as to provide a current surge handling ability in the Schottky diode.

2. The Schottky diode of claim 1, wherein the JBS regions have a first spacing and wherein the surge protection region has a width that is greater than the first spacing.

3. The Schottky diode of claim 2, wherein the first spacing is about 4 μm to about 6 μm and wherein the surge protection subregions have a second spacing of about 1 μm to about 3 μm.

4. The Schottky diode of claim 1, wherein the JBS regions have a first width of about 1 μm to about 3 μm and wherein the surge protection region has a second width that is larger than the first width.

5. The Schottky diode of claim 1, wherein the surge protection subregions extend into the drift region from the surface of the drift region by a depth of about 0.3 μm to about 0.5 μm.

6. The Schottky diode of claim 1, wherein an interface between the Schottky contact and the surge protection subregions is an ohmic contact.

7. The Schottky diode of claim 1, wherein the drift region comprises 4H—SiC, wherein the drift region has a doping level of about $5\times10^{15}$ cm$^{-3}$ to $1\times10^{16}$ cm$^{-3}$, and wherein the surge protection subregions have a doping level greater than $5\times10^{18}$ cm$^{-3}$.

8. The Schottky diode of claim 1, wherein a portion of the drift region beneath the surge protection regions has a higher electric potential than a portion of the drift region beneath the JBS regions in response to a forward voltage applied to the Schottky contact.

9. The Schottky diode of claim 1, further comprising an additional surge protection region in the drift region adjacent the Schottky contact.

10. The Schottky diode of claim 9, wherein the surge protection subregions define vertical current paths in the drift region between respective ones of the surge protection subregions, wherein a depth of the surge protection regions is defined by a depth of the trenches and a depth of the doped regions.

11. The Schottky diode of claim 1, wherein the surge protection subregions comprise a plurality of trenches in the drift region and a plurality of doped regions in the drift region extending beneath respective ones of the plurality of trenches.

12. The Schottky diode of claim 1, wherein the drift region comprises silicon carbide.

13. A Schottky diode, comprising:
  a silicon carbide drift region having a first conductivity type;
  a Schottky contact on the drift region;
  a plurality of junction barrier Schottky (JBS) regions at a surface of the drift region adjacent the Schottky contact, each of the plurality of JBS regions having a second conductivity type opposite the first conductivity type and having a first width; and
  a surge protection region at the surface of the drift region adjacent the Schottky contact, the surge protection region having a second width greater than the first width and comprising a plurality of surge protection subregions having the second conductivity type, wherein the surge protection region is configured to conduct at a forward voltage higher than a turn on voltage of the Schottky diode.

14. The Schottky diode of claim 13, wherein adjacent ones of the JBS regions are spaced apart by a first spacing, and wherein adjacent ones of the surge protection subregions are spaced apart by a second spacing that is less than the first spacing between adjacent ones of the JBS regions.

15. The Schottky diode of claim 13, wherein the JBS regions have a first spacing and wherein the surge protection region has a width that is greater than the first spacing.

16. The Schottky diode of claim 13, wherein an interface between the Schottky contact and the surge protection subregions is an ohmic contact.

17. The Schottky diode of claim 13, wherein a portion of the drift region beneath the surge protection regions has a higher electric potential than a portion of the drift region beneath the JBS regions in response to a forward voltage applied to the Schottky contact.

18. The Schottky diode of claim 13, further comprising a plurality of surge protection regions in the drift region adjacent the Schottky contact.

19. The Schottky diode of claim 13, wherein the surge protection subregions comprise a plurality of trenches in the drift region and a plurality of doped regions in the drift region extending beneath respective ones of the plurality of trenches.

20. The Schottky diode of claim 19, wherein the surge protection subregions define vertical current paths in the drift region between respective ones of the surge protection subregions, wherein a depth of the surge protection regions is defined by a depth of the trenches and a depth of the doped regions.

21. A Schottky diode, comprising:
  a silicon carbide drift region having a first conductivity type;
  a Schottky contact on the drift region;
  a plurality of junction barrier Schottky (JBS) regions at a surface of the drift region adjacent the Schottky contact, the plurality of JBS regions having a second conductivity type opposite the first conductivity type; and
  a surge protection region at the surface of the drift region adjacent the Schottky contact, the surge protection region comprising a plurality of surge protection subregions having the second conductivity type, wherein the surge protection subregions comprise a plurality of trenches in the drift region and a plurality of doped regions in the drift region extending beneath respective ones of the plurality of trenches, wherein the Schottky contact extends into the plurality of trenches and contacts the surge protection subregions in the trenches.

22. The Schottky diode of claim 21, wherein the surge protection subregions define vertical current paths in the drift region between respective ones of the surge protection subregions, wherein a depth of the surge protection regions is defined by a depth of the trenches and a depth of the doped regions.

23. The Schottky diode of claim 21, wherein the surge protection subregions are configured such that a voltage drop from a surface of the drift region to a center of a junction between one of the surge protection subregions and the drift region is sufficient to cause the junction to become forward biased at a forward current that is higher than a rated current of the Schottky diode so as to provide a current surge handling ability in the Schottky diode.

24. The Schottky diode of claim 21, wherein the Schottky contact forms ohmic contacts with the surge protection subregions.

* * * * *